(12) United States Patent
Mizukoshi et al.

(10) Patent No.: US 8,704,106 B2
(45) Date of Patent: Apr. 22, 2014

(54) FERROELECTRIC COMPONENT AND MANUFACTURING THE SAME

(75) Inventors: Masataka Mizukoshi, Kawasaki (JP); Yoshikatsu Ishizuki, Kawasaki (JP)

(73) Assignee: Fujitsu Limited, Kawasaki (JP)

( * ) Notice: Subject to any disclaimer, the term of this patent is extended or adjusted under 35 U.S.C. 154(b) by 5 days.

(21) Appl. No.: 13/113,229

(22) Filed: May 23, 2011

(65) Prior Publication Data

US 2011/0220397 A1 Sep. 15, 2011

Related U.S. Application Data

(63) Continuation of application No. PCT/JP2009/067830, filed on Oct. 15, 2009.

(30) Foreign Application Priority Data

Dec. 22, 2008 (JP) ................................ 2008-326143

(51) Int. Cl.
*H05K 1/11* (2006.01)

(52) U.S. Cl.
USPC .......... 174/262; 174/255; 174/256; 174/264; 257/678; 324/754.03; 29/825; 216/54; 428/209

(58) Field of Classification Search
USPC ................. 174/262, 255, 256, 264; 257/678; 324/754.03; 29/825; 216/54; 428/209
See application file for complete search history.

(56) References Cited

U.S. PATENT DOCUMENTS

| 5,259,926 A | * | 11/1993 | Kuwabara et al. | 216/54 |
| 5,374,469 A | * | 12/1994 | Hino et al. | 428/209 |
| 5,656,863 A | | 8/1997 | Yasunaga et al. | |
| 5,753,973 A | | 5/1998 | Yasunaga et al. | |
| 5,920,770 A | | 7/1999 | Yasunaga et al. | |
| 6,191,493 B1 | | 2/2001 | Yasunaga et al. | |
| 6,464,510 B1 | | 10/2002 | Len | 439/65 |
| 6,528,874 B1 | | 3/2003 | Iijima et al. | |
| 6,646,337 B2 | | 11/2003 | Iijima et al. | |
| 6,783,652 B2 | | 8/2004 | Iijima et al. | |
| 6,828,221 B2 | | 12/2004 | Iijima et al. | |
| 6,848,178 B2 | | 2/2005 | Kondo et al. | |

(Continued)

FOREIGN PATENT DOCUMENTS

| CN | 1292635 | 4/2001 |
| CN | 101231963 | 7/2008 |

(Continued)

OTHER PUBLICATIONS

International Search Report for International Application No. PCT/JP2009/067830 dated Jan. 8, 2010.

(Continued)

*Primary Examiner* — Xiaoliang Chen

(74) *Attorney, Agent, or Firm* — Kratz, Quintos & Hanson, LLP

(57) ABSTRACT

A method of manufacturing an electronic component includes forming a resin layer over an underlying layer, pressing a conductor plate including a pattern formed on one major surface thereof against the resin layer, and embedding the pattern in the resin layer, and performing polishing, Chemical Mechanical Polishing, or cutting by the use of a diamond bit on another major surface of the conductor plate until the resin layer appears, and leaving the pattern in the resin layer as a conductor pattern.

9 Claims, 52 Drawing Sheets

(56) References Cited

U.S. PATENT DOCUMENTS

| | | | |
|---|---|---|---|
| 6,853,060 B1 * | 2/2005 | Seok et al. | 257/678 |
| 7,096,578 B2 | 8/2006 | Iijima et al. | |
| 7,351,784 B2 | 4/2008 | Lehman, Jr. | 528/122 |
| 7,546,681 B2 | 6/2009 | Iijima et al. | |
| 7,636,215 B2 * | 12/2009 | Takai et al. | 360/48 |
| 7,721,422 B2 | 5/2010 | Iijima et al. | |
| 7,824,838 B2 | 11/2010 | Jo et al. | |
| 7,833,835 B2 | 11/2010 | Aoyagi et al. | |
| 7,882,627 B2 | 2/2011 | Koyama et al. | 29/849 |
| 7,923,828 B2 | 4/2011 | Endo et al. | 257/378 |
| 8,096,049 B2 | 1/2012 | Koyama et al. | 29/849 |
| 2002/0090754 A1 | 7/2002 | Chan et al. | 438/108 |
| 2004/0191491 A1 * | 9/2004 | Sugaya et al. | 428/209 |
| 2004/0251537 A1 | 12/2004 | Choi | |
| 2004/0256727 A1 | 12/2004 | Aoyagi et al. | |
| 2005/0218491 A1 * | 10/2005 | Sasaki et al. | 257/678 |
| 2006/0054350 A1 * | 3/2006 | Sugawa et al. | 174/255 |
| 2006/0079127 A1 * | 4/2006 | Endo et al. | 439/567 |
| 2006/0240360 A1 | 10/2006 | Cho | |
| 2007/0020397 A1 | 1/2007 | Cho | |
| 2007/0070613 A1 | 3/2007 | Kang | 361/803 |
| 2007/0090532 A1 | 4/2007 | Lehman | 257/777 |
| 2007/0108163 A1 * | 5/2007 | Hattori et al. | 216/85 |
| 2007/0114203 A1 | 5/2007 | Kang | 216/13 |
| 2007/0209199 A1 | 9/2007 | Iijima et al. | 29/836 |
| 2007/0281505 A1 | 12/2007 | Kobayashi et al. | 439/69 |
| 2008/0076207 A1 | 3/2008 | Yamano | |
| 2008/0079151 A1 | 4/2008 | Okayama | |
| 2008/0149381 A1 * | 6/2008 | Kawagishi et al. | 174/261 |
| 2008/0168652 A1 | 7/2008 | Koyama et al. | 29/830 |
| 2008/0291649 A1 * | 11/2008 | Mashino | 361/763 |
| 2009/0101510 A1 | 4/2009 | Kang | 205/125 |
| 2009/0224781 A1 * | 9/2009 | Aoyagi et al. | 324/754 |
| 2009/0309257 A1 * | 12/2009 | Park et al. | 264/220 |
| 2009/0314525 A1 * | 12/2009 | Kajino et al. | 174/255 |
| 2010/0022035 A1 * | 1/2010 | Yamano | 438/15 |
| 2011/0252637 A1 | 10/2011 | Endo et al. | 29/829 |

FOREIGN PATENT DOCUMENTS

| | | |
|---|---|---|
| JP | 56-51889 | 5/1981 |
| JP | 06-302604 | 10/1994 |
| JP | 8-264939 | 10/1996 |
| JP | 08-264939 | 10/1996 |
| JP | 2002-141637 A1 | 5/2002 |
| JP | 2002-171048 | 6/2002 |
| JP | 2003-347748 | 12/2003 |
| JP | 2004-200247 | 7/2004 |
| JP | 2005-5721 A1 | 1/2005 |
| JP | 2005-033153 | 2/2005 |
| JP | 2006-100463 A1 | 4/2006 |
| JP | 2006-303438 A1 | 11/2006 |
| JP | 2006-339365 A1 | 12/2006 |
| JP | 2007-36217 A1 | 2/2007 |
| JP | 2007-142403 A1 | 6/2007 |
| JP | 2008-021751 | 1/2008 |
| JP | 2008-84958 A1 | 4/2008 |
| JP | 2008-515241 | 5/2008 |
| JP | 2008-270745 | 11/2008 |
| KR | 10-2007-0052965 | 5/2007 |
| KR | 10-2008-0066607 | 7/2008 |

OTHER PUBLICATIONS

Extended European Search Report issued in corresponding application No. 09834606.7 dated Jul. 5, 2012 (6 pages).

Extended European Search Report issued in corresponding application No. 11181847.2 dated Jul. 12, 2012 (7 pages).

Extended European Search Report issued corresponding application No. 11181849.8 dated Jul. 12, 2012 (5 pages).

Notice of Preliminary Rejection received in related application No. 10-2011-7013143 from the Korean Intellectual Property Office dated Jun. 12, 2012 with English translation (9 pages).

Notice of Reason of Rejection received from the Japanese Patent Office in counterpart application No. 2010-543960 mailed Aug. 28, 2012 with English translation (6 pages).

First Office Action issued Jan. 29, 2013 from The State Intellectual Property Office of the People's Republic of China in counterpart application No. 200980152059.X with English translation (31 pages).

Japanese Office Action mailed on Jun. 18, 2013, in the corresponding Japanese patent application No. 0940497JPB.

* cited by examiner

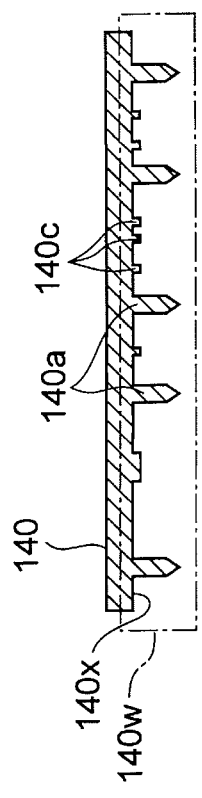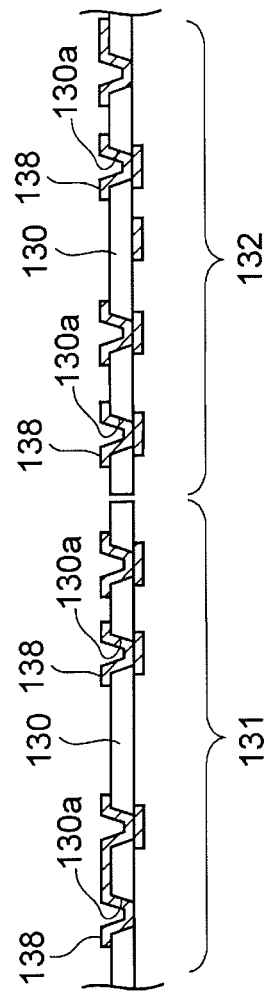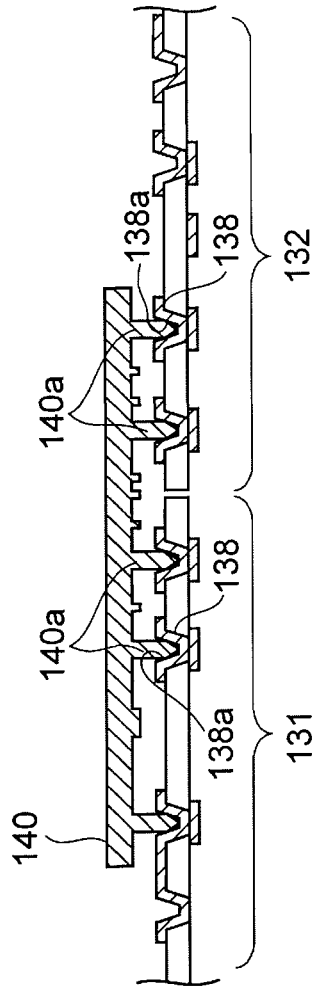
FIG. 8A
FIG. 8B

161

FERROELECTRIC COMPONENT AND MANUFACTURING THE SAME

CROSS-REFERENCE TO RELATED APPLICATIONS

This application is a continuation of prior International Patent Application No. PCT/JP2009/067830, filed on Oct. 15, 2009, the entire contents of which are incorporated herein by reference.

FIELD

The embodiments discussed herein are related to an electronic component and a method of manufacturing the electronic component.

BACKGROUND

Refinement of semiconductor devices such as an LSI is increasingly advanced, and some semiconductor products on the market have a wiring width of the order of submicron.

On the other hand, circuit boards on which semiconductor devices are mounted have a minimum wiring width of ten and several microns, which is greater by two orders of magnitude than the wiring width of semiconductor devices. In order to increase the speed of electronic devices and further miniaturize portable devices, semiconductor devices needs to be mounted on circuit boards with higher density, and for this purpose as well, reduction of the wiring width of the circuit boards is desired.

As a wiring formation method for circuit boards, the subtraction method, the semi-additive method, the imprint method, and others are known.

Among them, the subtraction method is that in which a wiring is formed by wet-etching a conductive film, using a resist pattern as a mask. Since the etching progresses isotropically, this method is disadvantageous in forming fine wiring, and is capable of only achieving a minimum wiring width of the order of 35 μm.

In the semi-additive method, after a seed layer is formed on an insulating layer, a plating resist is formed thereon, and then, a conductive film is formed in openings of the plating resist by electrolysis plating while power is supplied to the seed layer. After the plating resist is removed, the seed layer is wet-etched, thereby forming a wiring formed of the remaining conductive film which has not been etched.

Such semi-additive method allows the wiring width to be reduced as compared with the subtraction method. However, when the wiring width is of the order of 5 μm or less, it is difficult to form a wiring in a stable shape, and adhesion between the wiring and the underlying substrate is reduced. For these reasons, the semi-additive method is used to form a wiring of a width greater than 10 μm in many cases.

On the other hand, in the imprint method, a wiring groove or a hole is formed in a resin layer by engraving the resin layer with projections and depressions on the surface of a conductor plate (stamper). After the wiring groove is formed, a conductive film is formed in the wiring groove by an electroplating method or the like, and an excessive conductive film on the resin layer is removed by CMP (Chemical Mechanical Polishing) or the like to form a wiring in the wiring groove.

However, when the imprint method is used for forming a wiring in fine and complex shape, there occurs a problem that when the conductor plate is released from the resin layer, a part of the resin layer adheres to the conductor plate to damage the wiring groove. In addition, the imprint method has another problem in that the projections and depressions in the wiring shape formed on the conductor plate are deformed over repeated use of the conductor plate.

Note that the related techniques are disclosed in Japanese Laid-open Patent Publications No. 2007-36217, No. 2006-100463, No. 2005-5721, No. 2006-303438, and No. 2008-84958.

SUMMARY

According to an aspect of the following disclosure, a method of manufacturing an electronic component includes forming a resin layer over an underlying layer, pressing a conductor plate having a pattern formed on one major surface thereof against the resin layer, and embedding the pattern in the resin layer, and performing polishing, CMP, or cutting by the use of a diamond bit by the use of a diamond bit on another major surface of the conductor plate until the resin layer appears, and leaving the pattern in the resin layer as a conductor pattern.

According to another aspect of the disclosure, a method of manufacturing an electronic component includes connecting a pattern formed on one major surface of a conductor plate to an electrode pad of an underlying layer, injecting a resin between the conductor plate and the underlying layer, and forming a resin layer, and performing polishing, CMP, or cutting by the use of a diamond bit on another major surface of the conductor plate until the resin layer appears, and leaving the pattern in the resin layer as a conductor pattern.

In addition, according to still another aspect of the disclosure, a method of manufacturing an electronic component includes arranging a plurality of underlying layers each of which includes a recess portion formed on one major surface thereof, fitting a protrusion of a pattern formed on one major surface of a conductor plate into the recess portion of each of the underlying layers, and connecting the plurality of underlying layers through a conductor plate, forming a resin layer on the one major surface of each of the plurality of underlying substrates, and performing polishing, CMP, or cutting by the use of a diamond bit on another major surface of the conductor plate until the resin layer appears, and leaving the pattern in the resin layer as a conductor pattern.

Moreover, according to yet another aspect of the disclosure provides an electronic component includes an underlying layer, an electrode pad formed on the underlying layer, a resin layer formed on the underlying layer and the electrode pad, and a conductor pattern embedded in the resin layer on the electrode pad, wherein the conductor pattern and the electrode pad are bonded via a low melting point metal.

Furthermore, according to the other aspect of the disclosure, an electronic component includes an underlying layer, an electrode pad formed on the underlying layer, a resin layer formed on the underlying layer and the electrode pad, and a conductor pattern embedded in the resin layer and including a protrusion made into contact with the electrode pad, wherein a tip of the protrusion is deformed in a lateral direction on an upper surface of the electrode pad.

The object and advantages of the invention will be realized and attained by means of the elements and combinations particularly pointed out in the claims.

It is to be understood that both the foregoing general description and the following detailed description are exemplary and explanatory and are not restrictive of the invention, as claimed.

BRIEF DESCRIPTION OF DRAWINGS

FIGS. 8A to 8E are cross-sectional views of an electronic component in the course of manufacturing thereof according to an eighth embodiment;

DESCRIPTION OF EMBODIMENTS

Hereinafter, each embodiment is described in detail with reference to the accompanying drawings.

(1) First Embodiment

FIGS. 1A to 1D are cross-sectional views of an electronic component in the course of manufacturing thereof according to the present embodiment.

In the present embodiment, a circuit board as an electronic component is fabricated as follows.

Figure 1A:
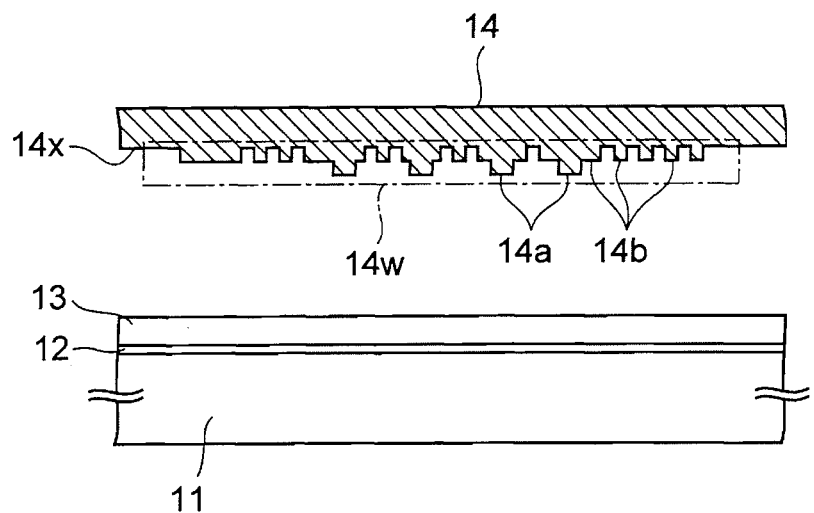
FIGS. 1A to 1D are cross-sectional views of an electronic component in the course of manufacturing thereof according to a first embodiment.

First, as illustrated in FIG. 1A, an adhesive layer 12 is formed on a transparent supporting substrate 11 such as a glass substrate. As the material for the adhesive layer 12, it is preferable to use a UV tape whose adhesive strength is reduced by irradiation of ultraviolet rays, or to use a heat foaming adhesive film whose adhesive strength is reduced by heating.

Next, thermosetting resin or thermoplastic resin is coated on the adhesive layer 12 to form a first resin layer 13 made of these materials with a thickness in a range of 10 to 20 μm. However, the thickness is defined according to a height of a projection pattern of a conductor plate later-described.

Thermosetting resin available for use as the first resin layer 13 includes, for example, epoxy-based resin, silicone-based resin, cyanate-based resin, polyolefin-based resin, acrylic-based resin, benzocyclobutene and the like.

In the case where these thermosetting resins are used, it is preferable to set the first resin layer 13 in a semi-cured state (B stage) by heating after the first resin layer 13 is formed.

Instead of coating with the resin in this manner, a film previously formed in semi-cured state (B stage) may be affixed to the adhesive layer 12 as the first resin layer 13.

Subsequently, a first conductor plate 14 in which a projection pattern 14w is formed on one major surface 14x is placed above the first resin layer 13, then the transparent supporting substrate 11 and the first conductor plate 14 are aligned.

The material of the first conductor plate 14 is not specifically limited. In the present embodiment, copper or copper alloy which is useful for reduction in the wiring resistance is used as the material for the first conductor plate 14.

Also, the projection pattern 14w of the first conductor plate 14 has first and second projection portions 14a, 14b in two levels with different heights as illustrated in the figure.

Figure 1B:
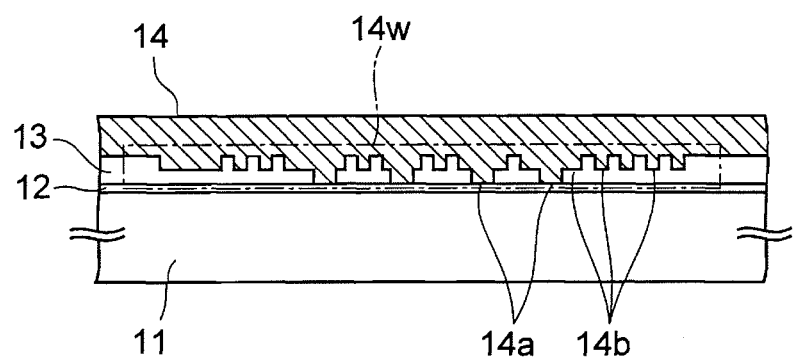

Next, as illustrated in FIG. 1B, in a decompressed atmosphere, the first conductor plate 14 is pressed against the first resin layer 13 so that the projection pattern 14w is embedded in the first resin layer 13.

Because the first resin layer 13 is set in a semi-cured state at this point as mentioned above, the first resin layer 13 is easily deformed as the first conductor plate 14 is pressed against the first resin layer 13, so that the projection pattern 14w can be embedded in the first resin layer 13 with no interstice.

Also, in the case where thermoplastic resin is used as the first resin layer 13, the first resin layer 13 is heated simultaneously with the pressing of the first conductor plate 14 to be softened, thereby the projection pattern 14w can be easily embedded in the softened first resin layer 13.

Furthermore, performing the present step in a decompressed atmosphere makes it possible to prevent air from entering the space between the first resin layer 13 and the first conductor plate 14 to generate an interstice therebetween.

Then by embedding such projection pattern 14w, the first projection portion 14a reaches the bottom face of the first resin layer 13, while the second projection portion 14b is embedded to a middle depth from a surface of the first resin layer 13.

Subsequently, the first resin layer 13 is cured by heating in the case where the first resin layer 13 is thermosetting resin. In contrast, in the case where the first resin layer 13 is thermoplastic resin, the first resin layer 13 is cured by cooling.

Figure 1C:
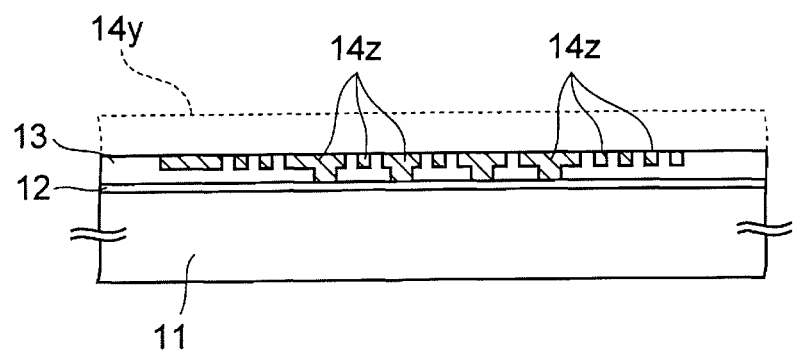

Subsequently, as illustrated in FIG. 1C, polishing, CMP, or cutting by the use of a diamond bit is performed on another major surface 14y of the first conductor plate 14 until the surface of the first resin layer 13 appears, and thus the projection pattern 14w as a first conductor pattern 14z is left in the first resin layer 13. From the viewpoint of reduction in the manufacturing cost, it is preferable to apply cutting by the use of a diamond bit with a low processing cost to the present step, rather than polishing or CMP. The cutting by the use of a diamond bit is also advantageous in that the projection pattern 14w can be processed at a higher speed than polishing or CMP.

Subsequently, the adhesive layer 12 is irradiated with ultraviolet rays via the transparent supporting substrate 11 to reduce the adhesive strength of the adhesive layer 12 so that the first resin layer 13 is released from the transparent supporting substrate 11. In the case where a heat foaming film is used as the adhesive layer 12, the adhesive strength of the adhesive layer 12 can be reduced by heating. As such heat foaming film, it is preferable to select what its releasability is not affected by the heat applied when the first thermosetting resin layer 13 is heat-cured.

Figure 1D:
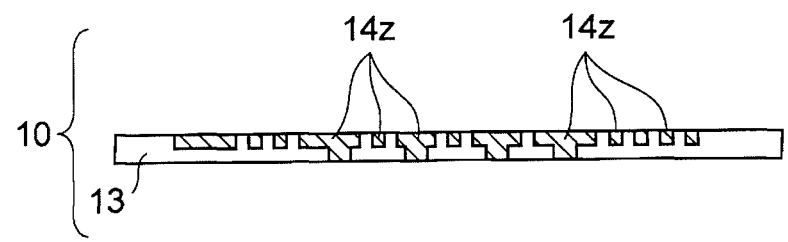

Thus, as illustrated in FIG. 1D, the basic structure of the circuit board 10, in which the first conductor pattern 14z is formed in the first resin layer 13, is completed.

The portion corresponding to the first projection portion 14a (see FIG. 1B) in the first conductor pattern 14z serves as a conductor plug, and another portion corresponding to the second projection portion 14b serves as a wiring.

The steps so far complete the main steps in the method of manufacturing the electronic component according to the present embodiment.

According to the above-described present embodiment, the projection pattern 14w of the first conductor plate 14 itself is utilized as the first conductor pattern 14z, and thus the first conductor plate 14 needs not be released from the first resin layer 13 unlike in the case of the imprint method.

Accordingly, the problem in the imprint method that a part of first resin layer 13 is lost during releasing the first conductor plate 14 can be solved. Accordingly, fine wiring whose minimum wiring width is of the order of 1 μm can be formed with a high yield.

Furthermore, for the formation of the first conductor pattern 14z, neither the step of forming a conductive film by an electroplating method, nor the step of patterning a conductive film by photolithography is needed. Accordingly, the manufacturing cost is lower as compared with the subtraction method or the semi-additive method.

(2) Second Embodiment

FIGS. 2A to 2D are cross-sectional views of the electronic component in the course of manufacturing thereof according to the present embodiment. The same elements as described in the first embodiment in these figures are labeled with the same reference symbols as in the first embodiment, and hereinafter the description is omitted.

Although the circuit board 10 including the first conductor pattern 14z in a single layer is fabricated as illustrated in FIG. 1D in the first embodiment, a circuit board in which two layers of conductor pattern are stacked is fabricated as follows in the present embodiment.

In order to fabricate the circuit board, the step in FIGS. 1A to 1C described in the first embodiment is performed first.

Figure 2A:
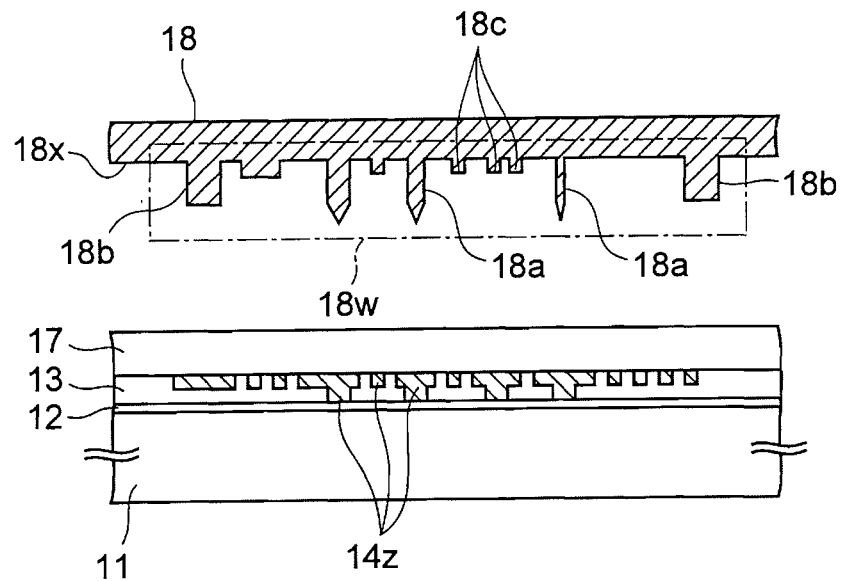
FIGS. 2A to 2D are cross-sectional views of an electronic component in the course of manufacturing thereof according to a second embodiment.

Next, as illustrated in FIG. 2A, a second thermosetting resin layer 17 is formed on each of the first resin layer 13 and the first conductor pattern 14z. The second resin layer 17 is then heated to be set in a semi-cured state.

Thermosetting resin available for use as the second resin layer 17 includes, for example, epoxy-based resin, silicone-based resin, cyanate-based resin, polyolefin-based resin, acrylic-based resin, and benzocyclobutene as described in the first embodiment.

Alternatively, instead of these thermosetting resins, thermoplastic resins may be used.

Subsequently, a second conductor plate 18 in which a projection pattern 18w is formed on one major surface 18x is placed above the second resin layer 17, then the transparent supporting substrate 11 and the second conductor plate 18 are aligned.

The second conductor plate 18 is made of, for example, copper or copper alloy, and has first and second protrusions 18a, 18b in addition to a projection portion 18c in a wiring shape.

Among them, the first protrusion 18a has a sharpened cone-like tip, while the second protrusion 18b has a flat tip. Width of the flat tip is wider than that of other portions of the projection pattern 18w such as the first protrusion 18a and the projection portion 18c, and is, for example, 100 to several 100 μm.

Figure 2B:
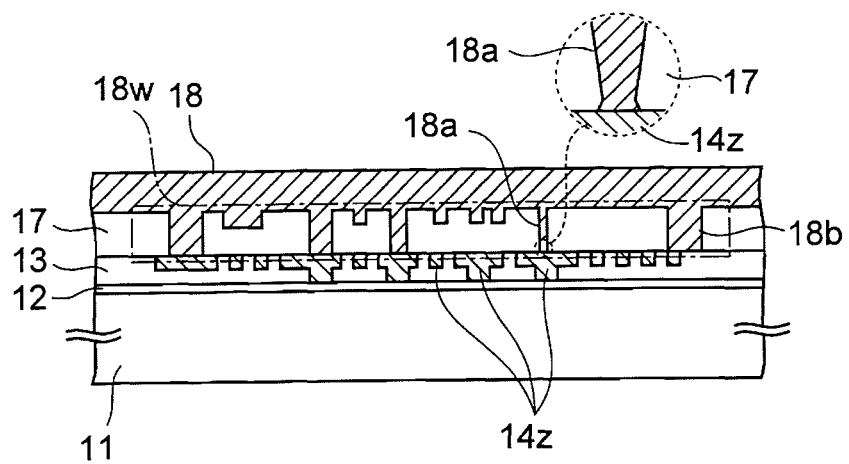

Next, as illustrated in FIG. 2B, the second conductor plate 18 is pressed against the second resin layer 17 in a semi-cured state to embed the projection pattern 18w in the second resin layer 17 so that the protrusions 18a, 18b are made into contact with the first conductor pattern 14z thereunder.

At this point, since the first protrusion 18a is made into contact with the underlying first conductor pattern 14z as illustrated in the dotted line circle, its cone-like tip is deformed to be expanded in the lateral direction on a surface of the first conductor pattern 14z. The cone-like tip thus deformed has the function of preventing the conductor plate 18 from being separated from the second resin layer 17 in the course of manufacturing the circuit board, as well as the function of increasing the contact area between the first conductor pattern 14z and the projection pattern 18w.

On the other hand, since the second protrusion 18b is made into contact with the underlying first conductor pattern 14z or the first resin layer 13 by the contact area larger than that of the first protrusion 18a, the second protrusion 18b serves to prevent the projection pattern 18w from being excessively embedded in the second resin layer 17 beyond the desired depth.

Subsequently, the second resin layer 17 is heated to be cured.

In the case where thermoplastic resin is used as the material for the second resin layer 17, it is preferable to embed the projection pattern 18w in the second resin layer 17 simultaneously with softening the second resin layer 17 by heating. In this case, after the projection pattern 18w is embedded, the second resin layer 17 is cooled to be cured.

Figure 2C:
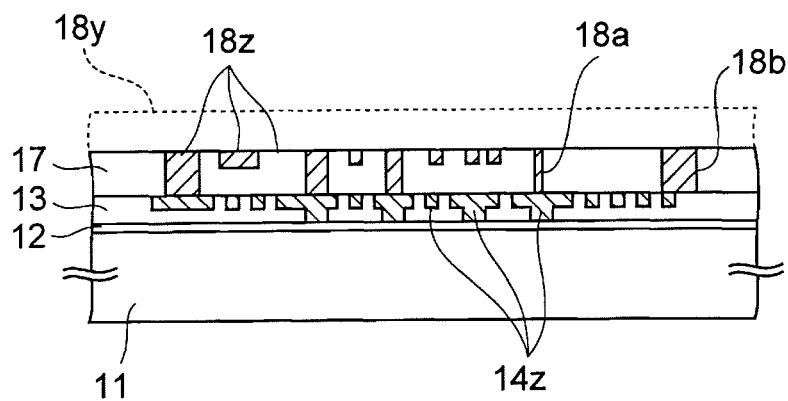

Subsequently, as illustrated in FIG. 2C, polishing, CMP, or cutting by the use of a diamond bit is performed on another major surface 18y of the second conductor plate 18 until the surface of the second resin layer 17 appears. Thereby the projection pattern 18w is left in the second resin layer 17 as a second conductor pattern 18z.

Subsequently, similarly to the first embodiment, the adhesive strength of the adhesive layer 12 is reduced by ultraviolet ray irradiation or heating, and then the first resin layer 13 is released from the transparent supporting substrate 11.

Figure 2D:
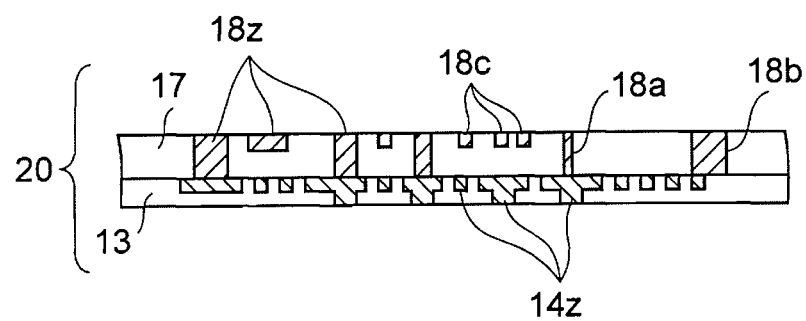

Thereby, as illustrated in FIG. 2D, the basic structure of the circuit board 20, in which the first conductor pattern 14z and second conductor pattern 18z are stacked, is completed.

In the circuit board 20, the previously-described protrusions 18a, 18b serve as a conductor plug which electrically connects between upper and lower conductor patterns 14z and 18z. The projection portion 18c serves also as a wiring embedded in the second resin layer 17.

According to the present embodiment described above, the circuit board 20 in which the fine wirings are stacked one above the other can be formed by embedding each projection pattern in the resin layer twice.

In addition, as illustrated in FIG. 2B, the tip of the first protrusion 18a is made cone-like. Accordingly, when the tip is made into contact with the upper surface of the first conductor pattern 14z, the tip is deformed and expanded in the lateral direction on a surface of the first conductor pattern 14z.

Consequently, the second conductor plate 18 is not easily separated from the second resin layer 17. Furthermore, the expansion of the tip of the protrusion 18a increases the contact area between the first conductor pattern 14z and the second conductor pattern 18z, thereby the contact resistance between the conductor patterns 14z and 18z can be reduced.

Furthermore, since the projection pattern 18w is provided with the second protrusion 18b, the projection pattern 18w can be prevented from being excessively embedded in the second resin layer 17.

In particular, since the width of the second protrusion 18b is made wider than that of the first protrusion 18a and the projection portion 18c in a wiring shape, sinking of the first protrusion 18a into the underlying first resin layer 13 is suppressed. Thereby, it becomes easy to obtain an advantage such as prevention of excessive embedding of the projection pattern 18w.

The increased width of the second protrusion 18b causes the electric resistance of the second protrusion 18b to be less than that of the first protrusion 18a and the projection portion 18c. For this reason, it is preferable to use the second protrusion 18b as a power source line or a grounding conductor through which current greater than that of a signal line passes.

Although the stacked conductor pattern in the above embodiment is formed of 2 layers, the embodiment is not limited to this configuration. For example, the step of forming the resin layer 17 (FIG. 2A), the step of embedding the projection pattern 18w in the resin layer 17 (FIG. 2B), and the step of leaving the conductor pattern 18z in the resin layer 17 (FIG. 2C), as one set, may be repeated for desired number of times to form three or more layers of stacked conductor patterns.

(3) Third Embodiment

FIGS. 3A to 3E are cross-sectional views of the electronic component in the course of manufacturing thereof according to the present embodiment.

While the circuit board is fabricated as an electronic component using a conductor plate in the first and second embodiments, a conductor pattern is formed in the following manner on a circuit board which is already prepared in the present embodiment.

Figure 3A:
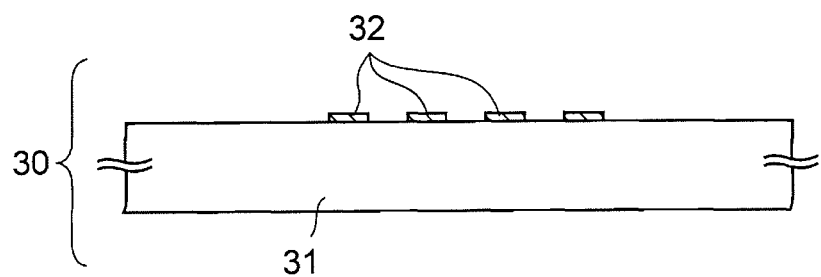
FIGS. 3A to 3E are cross-sectional views of an electronic component in the course of manufacturing thereof according to a third embodiment.
Figure 3B:
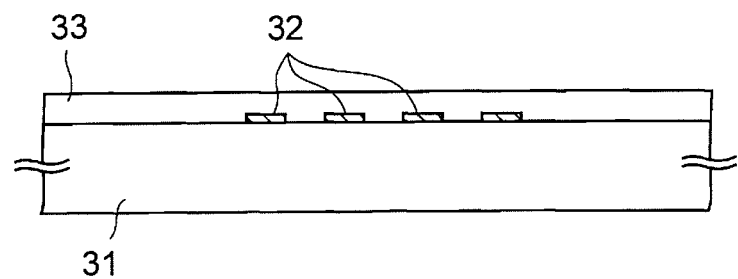

First, as illustrated in FIG. 3A, the circuit board 30 is prepared in a state such that an electrode pads 32 formed of, for example, a copper film having a thickness in a range of 5 to 10 μm are formed on the surface of a resin base material 31.

Instead of the resin base material 31, a build-up substrate, in which an insulating layer and a wiring layer are alternately formed multiple times, may be used.

Next, as shown in FIG. 33, thermosetting resin is coated on the circuit board 30 to form, for example, a resin layer 33 having a thickness in a range of 10 to 20 μm. The material for the resin layer 33 is not specifically limited, and epoxy-based resin, silicone-based resin, cyanate-based resin, polyolefin-based resin, acrylic-based resin, and benzocyclobutene are available for use.

Then the resin layer 33, after being formed, is heated to be in a semi-cured state.

Alternatively, instead of the above-mentioned thermosetting resins, thermoplastic resins may be used as the material for the resin layer 33.

Figure 3C:
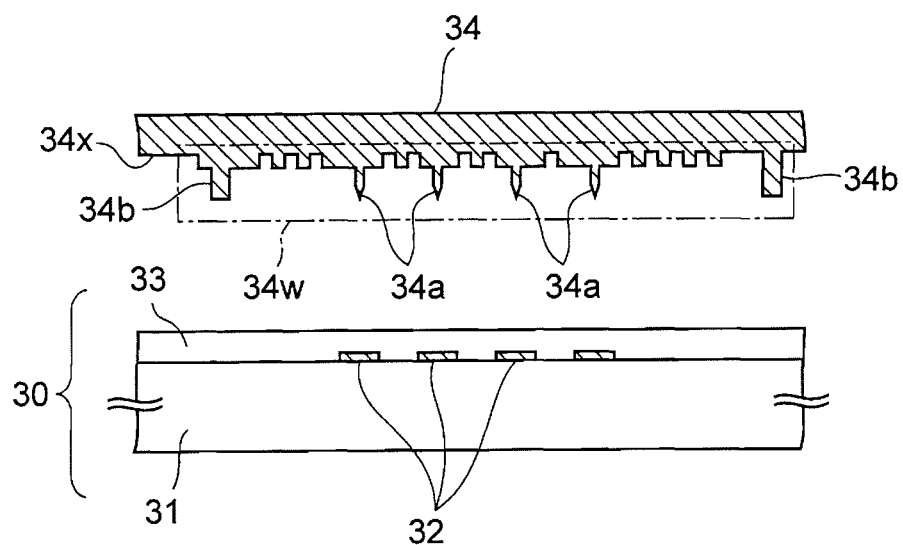

Next, as shown in FIG. 3C, a conductor plate 34 in which a projection pattern 34w is formed on one major surface 34x is placed above the resin layer 33, then the circuit board 30 and the conductor plate 34 are aligned.

Similarly to the second embodiment, the projection pattern 34w includes a first protrusion 34a having a cone-like tip, and a second protrusion 34b having a flat tip.

Also, as the material for the conductor plate 34, it is preferable to use copper or copper alloy which is useful for reduction in the wiring resistance.

Figure 3D:
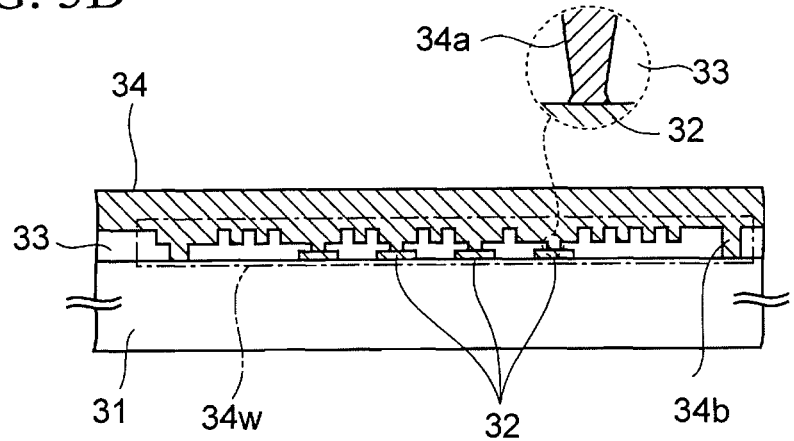

Then as illustrated in FIG. 3D, the conductor plate 34 is pressed against the resin layer 33 in a semi-cured state to embed the projection pattern 34w in the resin layer 33. Thereby, the first protrusion 34a is made into contact with the electrode pad 32 and its tip is deformed so that the risk of separation of the conductor plate 34 from the resin layer 33 is reduced, while the contact area between the electrode pad 32 and the projection pattern 34w is increased.

Also, since the second protrusion 32b is made into contact with the underlying resin base material 31, it is possible to prevent excessive embedding of the conductor plate 34.

Subsequently, the resin layer 33 is heated to be cured.

In the case where thermosetting resin is used as the material for the resin layer 33, it is preferable to embed the projection pattern 34w in the resin layer 33 simultaneously with softening the resin layer 33 by heating, and then cool the resin layer 33 to cure.

Figure 3E:
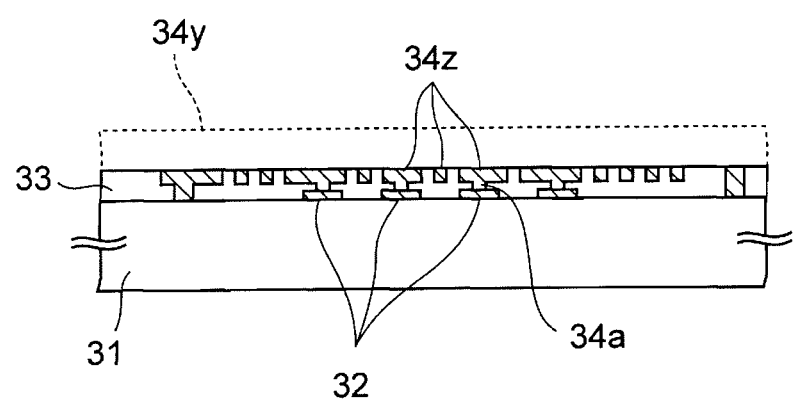

Subsequently, as illustrated in FIG. 3E, polishing, CMP, or cutting by the use of a diamond bit is performed on another major surface 34y of the conductor plate 34 until the surface of the resin layer 33 appears. Thereby the projection pattern 34w is left in the resin layer 33 as a conductor pattern 34z.

The portion corresponding to the first protrusion 34a in the conductor pattern 34z serves as a conductor plug, and the rest of the portion serves as a wiring.

The steps so far complete the main steps in the method of manufacturing the electronic component according to the present embodiment.

According to the above-described present embodiment, the projection pattern 34w embedded in the resin layer 33 is utilized as the conductor pattern 34z. Thereby, it is possible to form fine conductor pattern 34z on the resin base material 31 for the same reason as described in the first embodiment.

While the resin layer 33 is formed on the circuit board 30 in the above embodiment, the underlying substrate for the resin layer 33 is not limited to the circuit board 30. For example, instead of the resin base material 31, a semiconductor device whose surface is provided with the electrode pad 32 may be used to form the resin layer 33 on the semiconductor device. In this case, the conductor pattern 34z can be used as a rewiring layer on the semiconductor device.

(4) Fourth Embodiment

In the present embodiment, the third embodiment is modified to fabricate a circuit board as an electronic component in the following manner.

FIGS. 4A to 4F are cross-sectional views of the electronic component in the course of manufacturing thereof according to the present embodiment. The same elements as described in the third embodiment in these figures are labeled with the same reference symbols as in the third embodiment, and hereinafter the description is omitted.

Figure 4A:
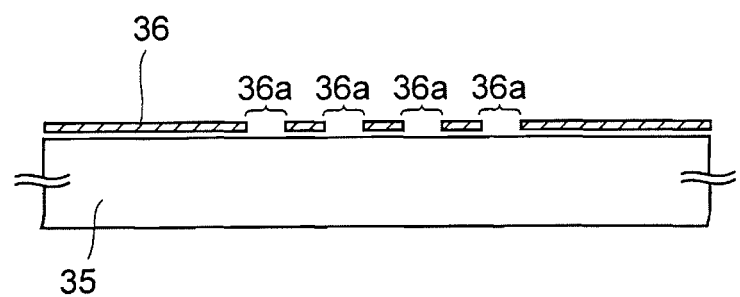
FIGS. 4A to 4F are cross-sectional views of an electronic component in the course of manufacturing thereof according to a fourth embodiment.

First, as illustrated in FIG. 4A, a metal mask 36 is placed on a substrate 35 of a flat upper surface like a glass substrate or the like.

The metal mask 36 is formed of a stainless plate or a nickel plate having a thickness in a range of 20 to 100 μm, and has openings 36a having a diameter almost equivalent to the board thickness.

Figure 4B:
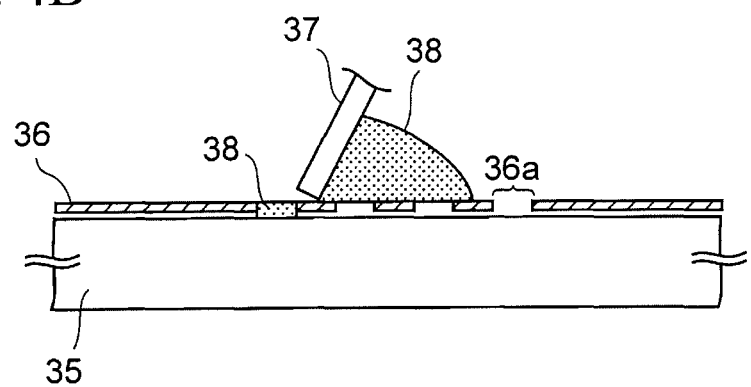

Next, as illustrated in FIG. 4B, a low melting point metal paste 38 which is made by dispersing nano-particles of Sn in an organic solvent such as diethylene glycol is supplied on the metal mask 36, then later a squeegee 37 is moved along the surface of the metal mask 36, and the low melting point metal paste 38 is printed on the substrate 35 under the opening 36a.

The nano-particles included in the low melting point metal paste 38 is not limited to Sn particles, and may be metallic particles with a melting point lower than that of Sn, i.e., 230° C. or less. For such metallic particles, for example, SnAg alloy particles or SnBi alloy particles are available. In addition, paste including the organic acids of Sn may be used as the low melting point metal paste 38.

Figure 4C:
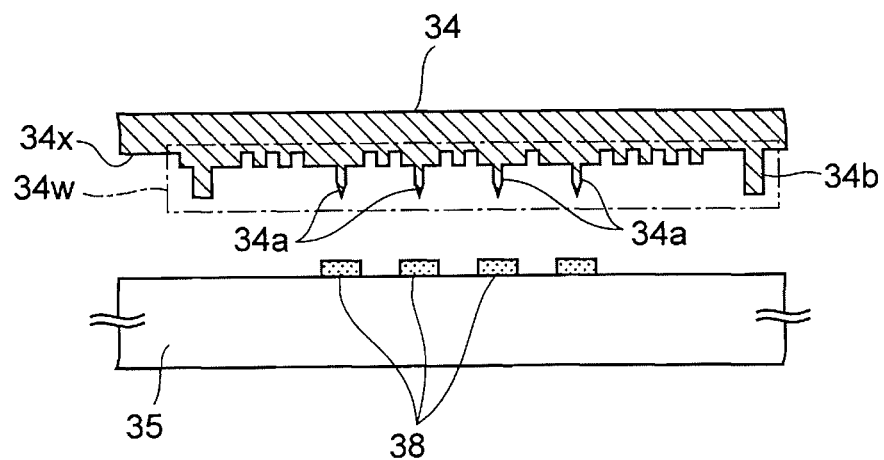

Subsequently, as illustrated in FIG. 4C, the conductor plate 34 described in the third embodiment is arranged to be opposed to the substrate 35. Then the conductor plate 34 is lowered to the substrate 35 to transfer the low melting point metal paste 38 to the tip end of the first protrusion 34a of the conductor plate 34.

Figure 4D:
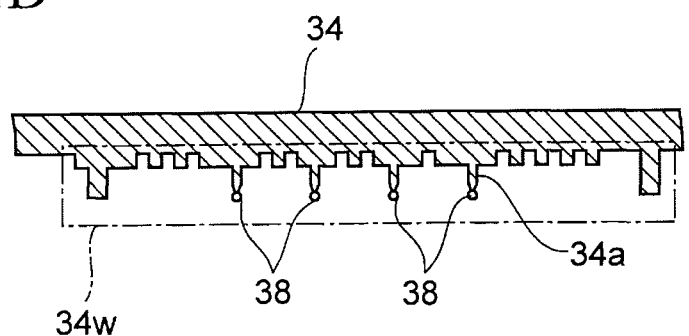

Then as illustrated in FIG. 4D, the conductor plate 34 is heated to a temperature in a range of 150 to 250° C. to evaporate the solvent component in the low melting point metal paste 38. The method of heating the conductor plate 34 is not specifically limited, and a hot plate or a furnace may be used to heat the conductor plate 34.

Figure 4E:
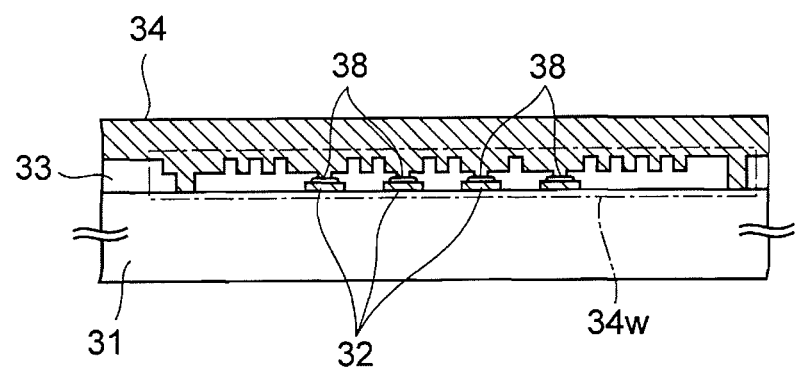

Subsequently, as illustrated in FIG. 4E, the projection pattern 34w of the above-mentioned conductor plate 34 is embedded in the resin layer 33 which is coated on the circuit board 30 according to the third embodiment.

At the same time when the projection pattern 34w is embedded, or after the projection pattern 34w is made into contact with the electrode pad 32, the low melting point metal paste 38 is heated to be melted so that the first protrusion and the electrode pad 32 are bonded via the low melting point metal paste 38.

The heating method for the low melting point metal paste 38 is not specifically limited. For example, a hot plate or a furnace may be used in the present embodiment to heat the low melting point metal paste 38 to a temperature in a range of 200 to 240° C.

Note that the state of the resin layer 33 when the projection pattern 34w is embedded therein is not specifically limited. In the case where thermosetting resin is used as the resin layer 33, it is preferable that the resin layer 33 is semi-cured by pre-heating to embed the projection pattern 34w therein.

In the case where thermosetting resin is used as the resin layer 33, it is preferable that the resin layer 33 is heated to be softened simultaneously with embedding the projection pattern 34w. In this case, heating for softening the resin layer 33 may also serve as heating for melting the low melting point metal paste 38.

Figure 4F:
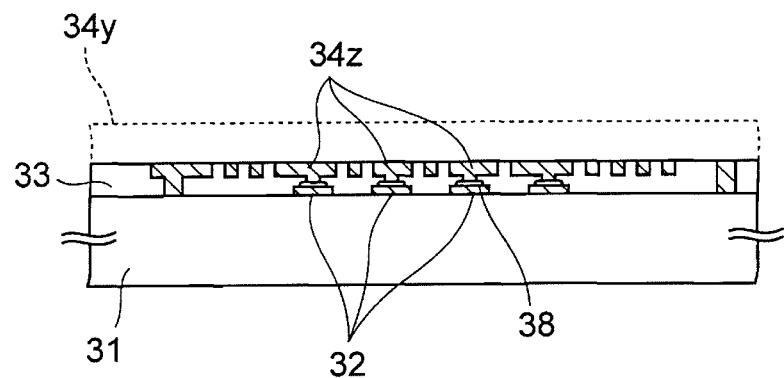

Then after the resin layer 33 is cured, as illustrated in FIG. 4F, polishing, CMP, or cutting by the use of a diamond bit is performed on another major surface 34y of the conductor plate 34 until the surface of the resin layer 33 appears. Thereby the projection pattern 34w is left in the resin layer 33 as a conductor pattern 34z.

The steps so far complete the main steps in the method of manufacturing the electronic component according to the present embodiment.

According to the above-described present embodiment, as illustrated in FIG. 4D, the low melting point metal paste 38 is fixed to the tip of the projection pattern 34w. Bonding strength between the projection pattern 34w and the electrode pad 32 can be increased with the low melting point metal paste 38.

Furthermore, the contact area between the projection pattern 34w and the electrode pad 32 is also increased because of the low melting point metal paste 38. Accordingly, the electric resistances between them can also be reduced.

(5) Fifth Embodiment

As described in the first to fourth embodiments, a fine conductor pattern can be formed utilizing the projection pattern of the conductor plate.

However, as a layer for which the fine conductor pattern is not needed, a conductor pattern may be formed by the conventional subtraction method or semi-additive method.

In the present embodiment, a module on which semiconductor devices are mounted is fabricated as an electronic component while using such conventional methods.

FIGS. 5A to 5L are cross-sectional views of the electronic component in the course of manufacturing thereof according to the fifth embodiment. The same elements as described in the first embodiment in these figures are labeled with the same reference symbols as in the first embodiment, and hereinafter the description is omitted.

Figure 5A:
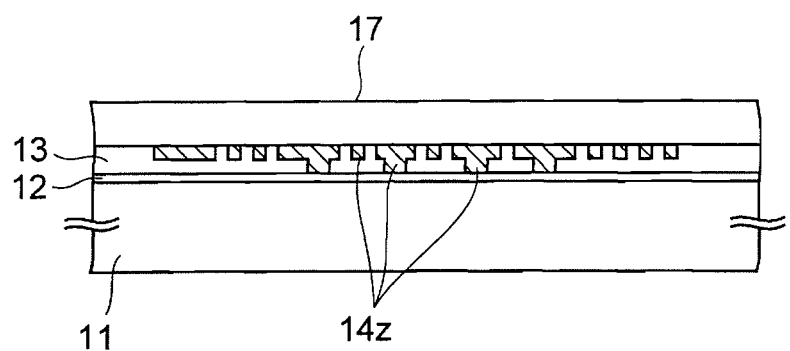
FIGS. 5A to 5L are cross-sectional views of an electronic component in the course of manufacturing thereof according to a fifth embodiment.

In order to fabricate the electronic component, the steps in FIGS. 1A and 1C described in the first embodiment are performed first, then as illustrated in FIG. 5A, the second resin layer 17 made of thermosetting resin is formed on each of the first resin layer 13 and the first conductor pattern 14z.

For the thermosetting resin, for example, epoxy-based resin, silicone-based resin, cyanate-based resin, polyolefin-based resin, acrylic-based resin, and benzocyclobutene are available.

Alternatively, instead of these thermosetting resins, thermoplastic resins may be used.

Figure 5B:
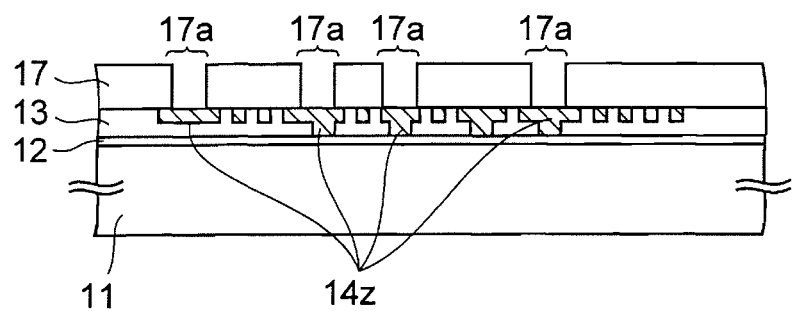

Then the second resin layer 17, after being cured, is irradiated with laser beam such as an excimer laser beam as illustrated in FIG. 5B to form a hole 17a in which the first conductor pattern 14z is exposed. The diameter of the hole 17a is not specifically limited. For example, the diameter of the hole 17a may be in a range of 20 to 50 μm in the present embodiment.

Figure 5C:
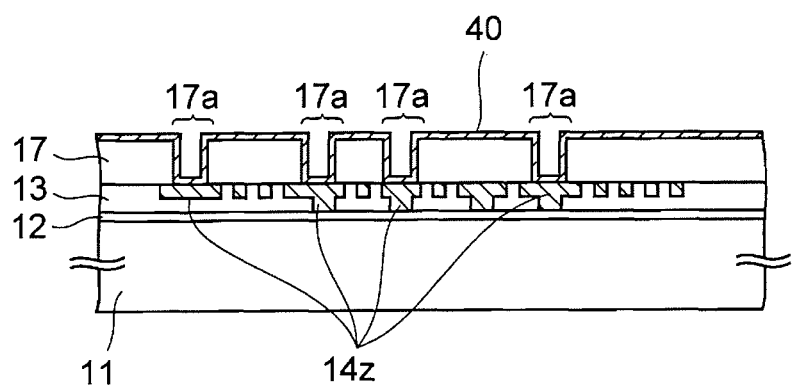

Next, as illustrated in FIG. 5C, a sputtering method is carried out to form a copper film as a seed layer 40 with a thickness of the order of 0.1 μm on the inner surface of the hole 17a, and the upper surface of the second resin layer 17.

Instead of the sputtering method, electroless plating may be used to form the seed layer 40.

Figure 5D:
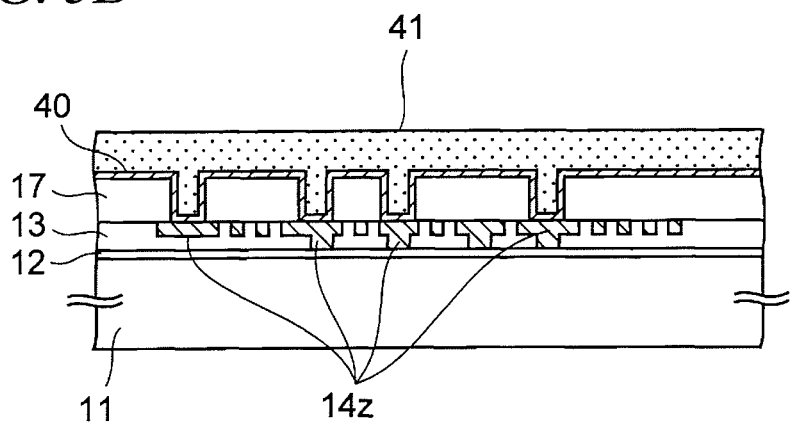

Subsequently, as illustrated in FIG. 5D, a liquefied photoresist 41 is coated on the seed layer 40, and then is baked to come to a semi-cured state. Instead of using the liquefied photoresist in this manner, the photoresist 41 in a film state may be used to be affixed on the seed layer 40.

Figure 5E:
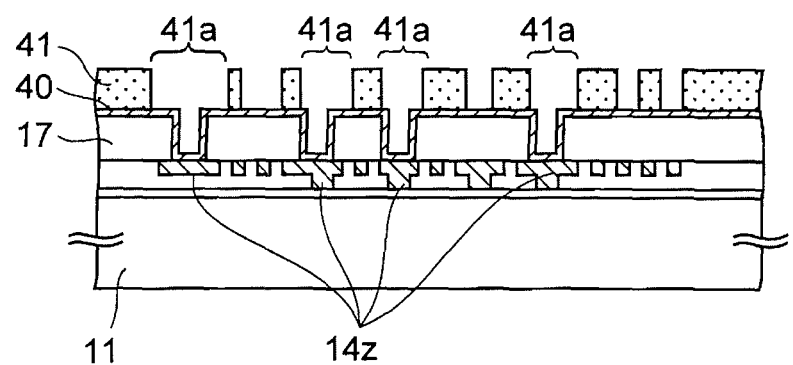

Subsequently, as illustrated in FIG. 5E, the photoresist 41 is exposed and developed to form windows 41a in a wiring shape in the photoresist 41.

Figure 5F:
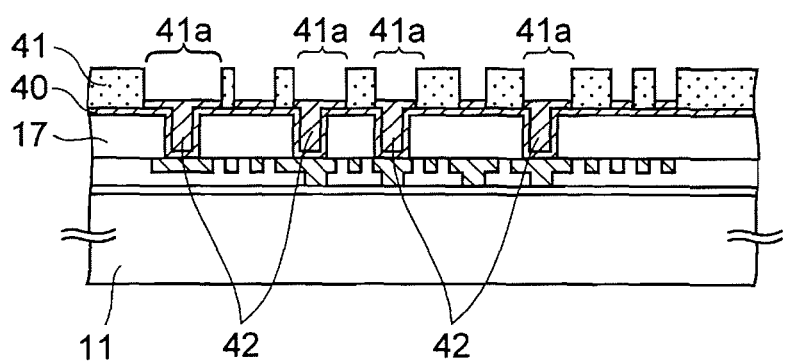

Next, as illustrated in FIG. 5F, electrolysis plating is performed with power supplied to the seed layer 40 to form a conductive layer 42 with a thickness in a range of 5 to 30 μm on the seed layer 40 in the window 41a.

Instead of the electrolysis plating, the vapor deposition method or the printing method may be used to form the conductive layer 42. In the case where the printing method between them is used, an inkjet method can be used to print nano-paste containing conductive nano-particles such as copper on the seed layer 40 in the window 41a and to thereby form the conductive layer 42

Figure 5G:
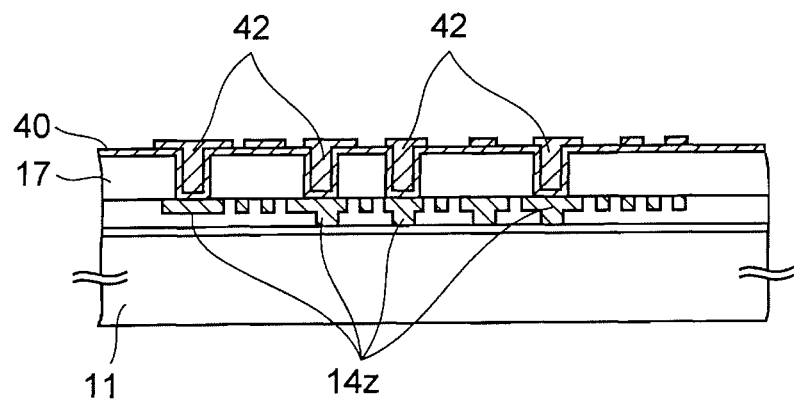

Subsequently, the photoresist 41 is removed as illustrated in FIG. 5G.

Figure 5H:
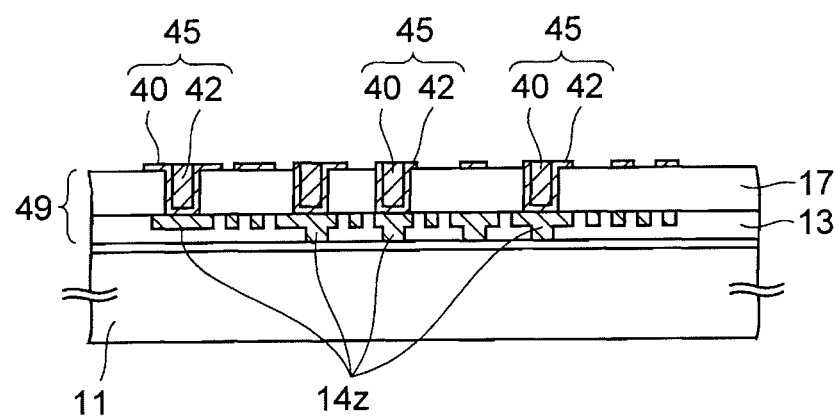

Next, as ilustrayed in FIG. 5H, wet etching is carried out using chemical solution of hydrogen peroxide including sulfuric acid based solution as etching solution to remove part of the seed layer 40 where the conductive layer 42 is not formed and to leave the seed layer 40 and the conductive layer 42 which are not etched as a second conductor pattern 45. The formation method of such second conductor pattern 45 is called a semi-additive method.

The steps so far result in formation of a circuit board 49 which includes the first and second resin layers 13, 17, and the first and second conductor patterns 14z, 45 on the transparent supporting substrate 11.

Figure 5I:
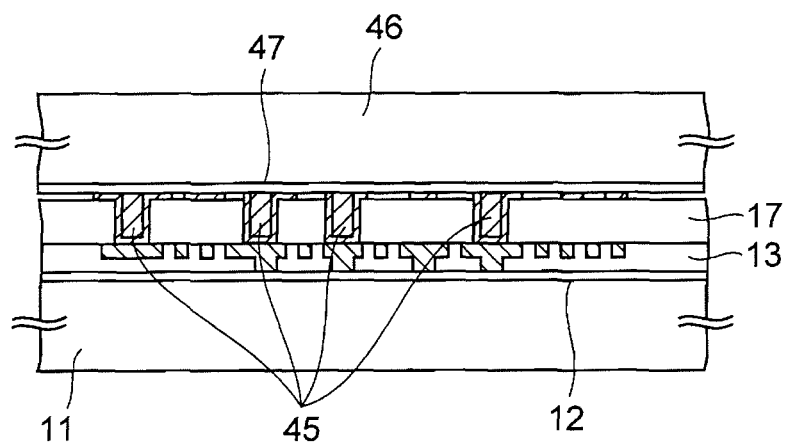

Subsequently, as illustrated in FIG. 5I, a transparent supporting substrate 46 for mounting device is affixed via an adhesive layer 47 on the second conductor pattern 45. The transparent supporting substrate 46 for mounting device is preferably a translucent substrate such as a glass substrate.

Also, as the material for the adhesive layer 47, it is preferable to use a UV tape whose adhesive strength is reduced by irradiation of ultraviolet rays, or to use a heat foaming adhesive film whose adhesive strength is reduced by heating.

Figure 5J:
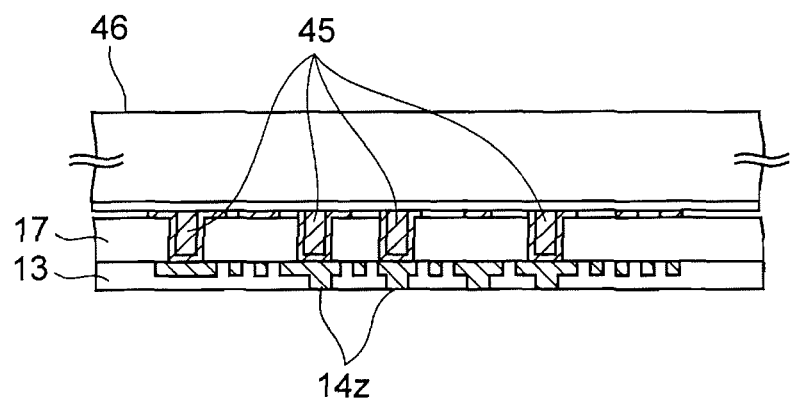

Then the adhesive layer 12 is irradiated with ultraviolet rays via the transparent supporting substrate 11 to reduce the adhesive strength of the adhesive layer 12, and then the first resin layer 13 is released from the transparent supporting substrate 11 as illustrated in FIG. 5J.

In the case where a heat foaming film is used as the adhesive layer 12, the adhesive strength of the adhesive layer 12 may be reduced by heating so as to release the transparent supporting board 11 as described above.

Such release of the transparent supporting board 11 causes the first conductor pattern 14z to appear on the bottom face of the first resin layer 13.

Figure 5K:
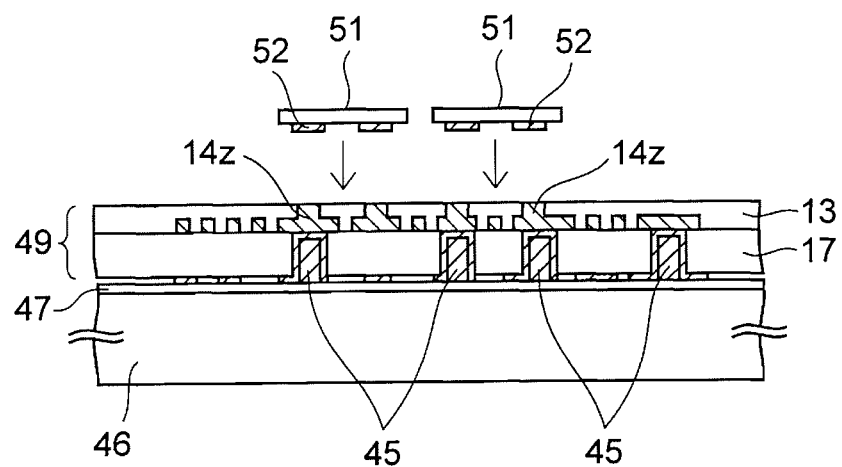

Next, as illustrated in FIG. 5K, the transparent supporting substrate 46 for mounting device is turned down to appear the first conductor pattern 14z, and then an external connection terminal 52 of a semiconductor device 51 is bonded to the appearing first conductor pattern 14z. The external connection terminal 52 is formed of, for example, gold bumps which is bonded on the first conductor pattern 14z by ultrasonic bonding.

Instead of using ultrasonic bonding, an electrical connection may be used to electrically connect the external connection terminal 52 and the first conductor pattern 14z via a low melting point solder or an anisotropy conductive film.

Also, the present step is performed while supporting the circuit board 49 with the transparent supporting substrate 46 for mounting device, thereby the semiconductor device 51 can be bonded on the circuit board 49 while suppressing the bending thereof. Accordingly, operability of the circuit board 49 during bonding is increased.

Figure 5L:
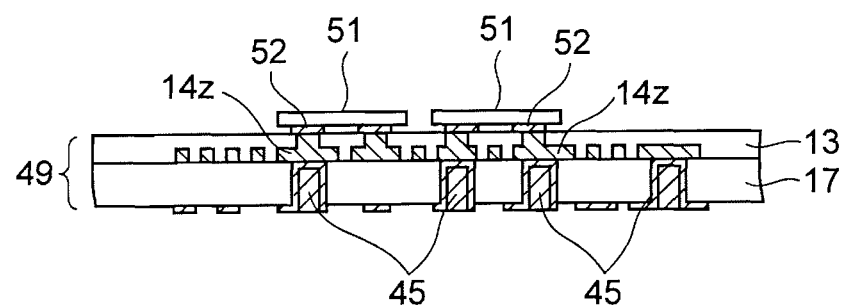

Subsequently, as illustrated in FIG. 5L, the adhesive strength of the adhesive layer 47 is reduced by ultraviolet irradiation through the transparent supporting substrate 46 for mounting device, and then the supporting substrate 46 for mounting device is released from the circuit board 49.

In the case where a heat foaming film is used as the adhesive layer 47, the adhesive strength of the adhesive layer 47 may be reduced by heating.

Thus, the module in which the semiconductor device 51 is mounted on the circuit board 49 is completed.

According to the present embodiment, the first conductor pattern 14z, which is on a side closer to the semiconductor device 51 on the circuit board 49, is formed according to the first embodiment. Accordingly, the width of the first conductor pattern 14z can be made fine on the basis of the reason described in the first embodiment.

In addition, regarding the second conductor pattern 45 apart from the semiconductor device 51 and thereby needing no fine wiring width, the conventionally established semi-additive method may be carried out to form the second conductor pattern 45.

Thereby, it is possible to manufacture the modules while utilizing the existing manufacturing equipment in relevant mass production facilities.

The device mounted on the circuit board 49 is not limited to the semiconductor device 51, and may be an arbitrary electronic device, for example, a capacitor or a resistance element.

(6) Sixth Embodiment

In the present embodiment, a module in which semiconductor devices are mounted on a multilayered circuit substrate is fabricated in the following manner.

FIGS. 6A to 6D are cross-sectional views of the electronic component in the course of manufacturing thereof according to the present embodiment.

Figure 6A:
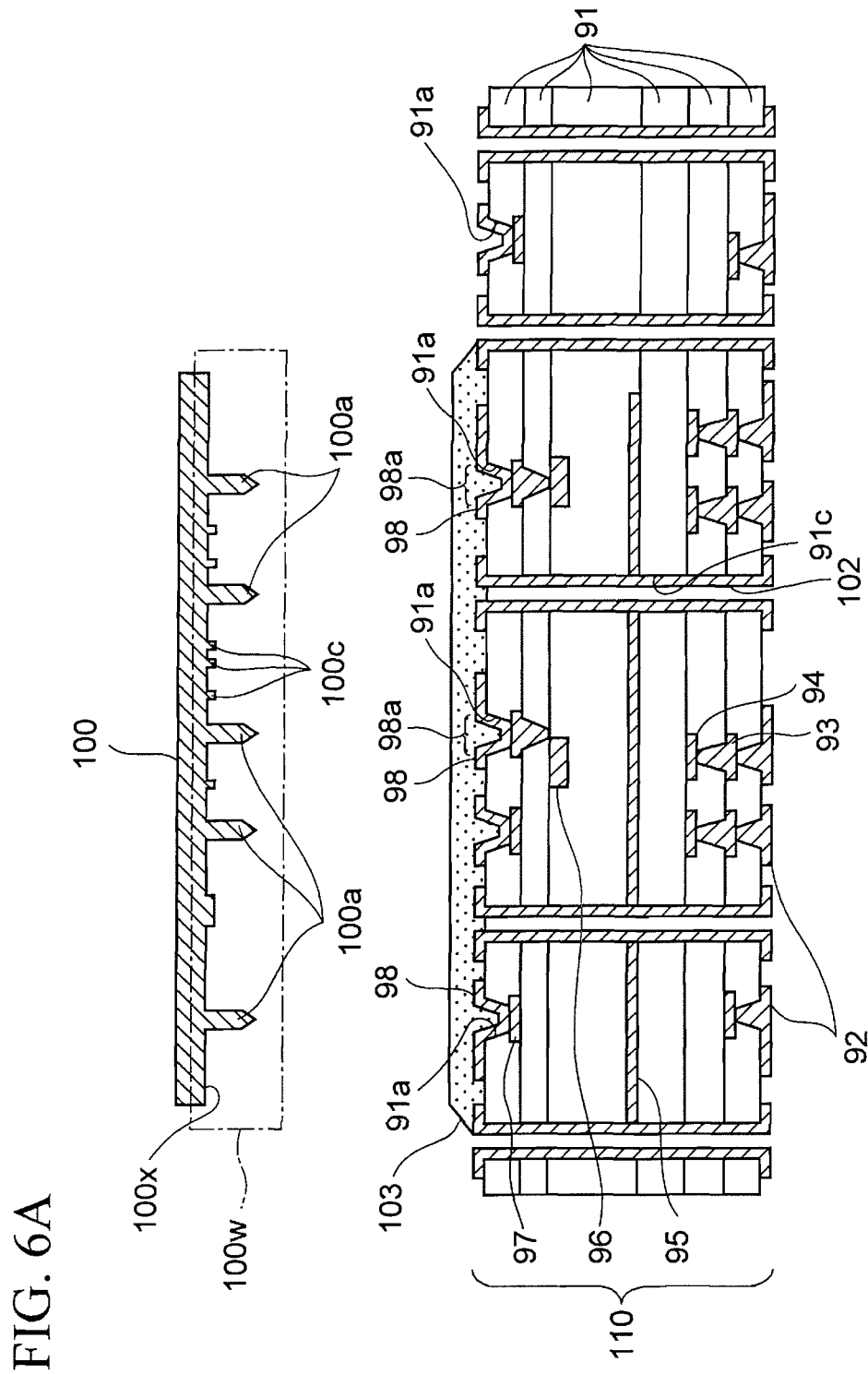
FIGS. 6A to 6D are a cross-sectional views of an electronic component in the course of manufacturing thereof according to a sixth embodiment.

In order to manufacture the electronic component, a multilayered circuit substrate 110 is first prepared as illustrated in FIG. 6A.

The multilayered circuit substrate 110 is formed by alternately stacking a plurality of circuit patterns 92 to 98 and insulating layers 91. Among them, each of the circuit patterns 92 to 98 is formed of a copper film, for example, and the insulating layer 91 is formed of an epoxy resin, for example.

Then a through hole 91c is formed so as to pass through the multilayered circuit substrate 110, a copper plating film 102 is formed on the inner surface of the through hole, and the circuit pattern 92 of the bottom layer and the circuit pattern 98 of the top layer are electrically connected via the copper plating film 102.

The circuit pattern 98 of the top layer is also formed on the inner surface of a via hole 91a of the insulating layer 91, and a recess portion 98a reflecting the shape of the via hole 91a is formed in the circuit pattern 98.

In the present step, a thermosetting resin layer 103 is formed on the top layer of the multilayered circuit substrate 110 thus prepared.

Thermosetting resin available for use as the resin layer 103 includes, for example, epoxy-based resin, silicone-based resin, cyanate-based resin, polyolefin-based resin, acrylic-based resin, and benzocyclobutene.

In the case where these thermosetting resins are used, it is preferable to set the resin layer 103 in a semi-cured state by heating after the resin layer 103 is formed.

Alternatively, instead of these thermosetting resins, thermoplastic resins may be used.

Subsequently, a conductor plate 100 in which a projection pattern 100w is formed on one major surface 100x is placed above the resin layer 103, then the multilayered circuit substrate 110 and the conductor plate 100 are aligned.

The conductor plate 100 is formed of, for example, copper or copper alloy, and has a protrusion 100a and a projection portion 100c in a wiring shape.

Between them, the protrusion 100a may have a sharpened cone-like tip as illustrated in the figure.

Figure 6B:
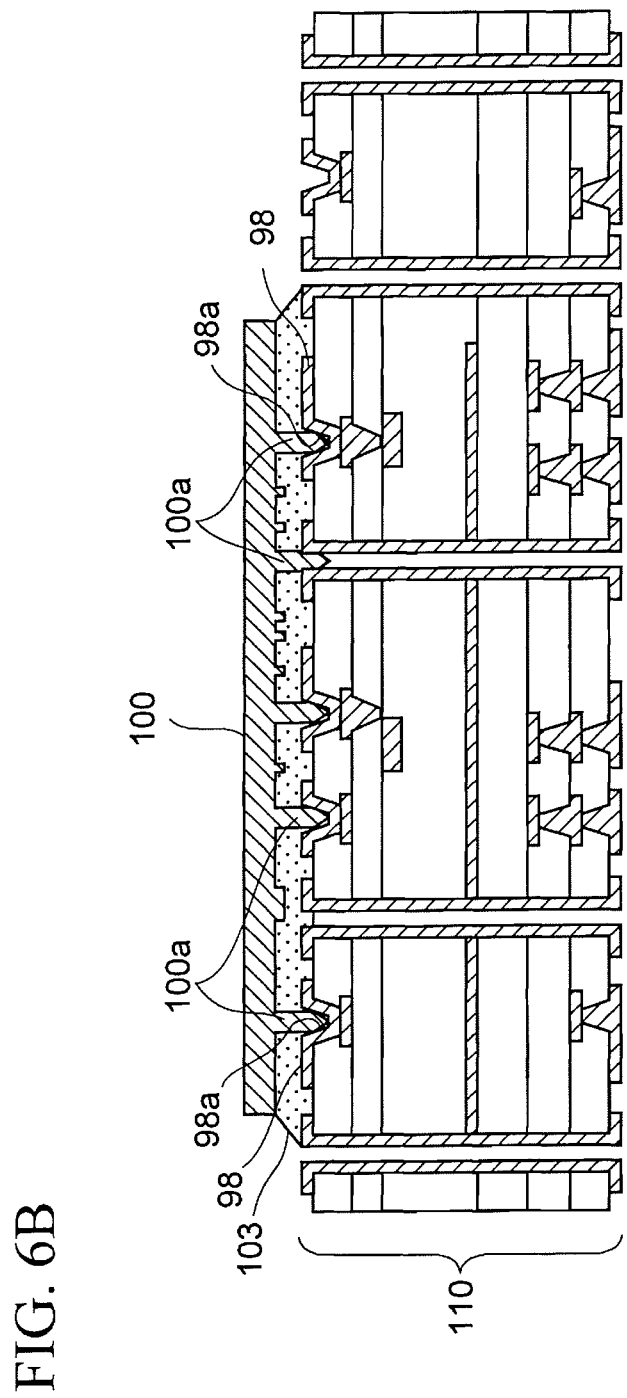

Next, as illustrated in FIG. 6B, the conductor plate 100 is pressed against the resin layer 103 in a semi-cured state to embed the projection pattern 100w in the resin layer 103. Then the protrusion 100a is fitted into the recess portion 98a and is deformed to be made into close contact with the recess portion 98a.

Subsequently, the resin layer 103 is heated to be cured.

In the case where thermoplastic resin is used as the material for the resin layer 103, it is preferable to embed the projection pattern 100w in the resin layer 103 simultaneously with softening the resin layer 103 by heating. In this case, after the projection pattern 100w is embedded, the resin layer 103 is cooled to be cured.

After the protrusion 100a is fitted into the recess portion 98a and is deformed to be made into close contact with the recess portion 98a, the resin layer 103 may be injected between the conductor plate 100 and the multilayered circuit substrate 110 and then be cured by heating.

Figure 6C:
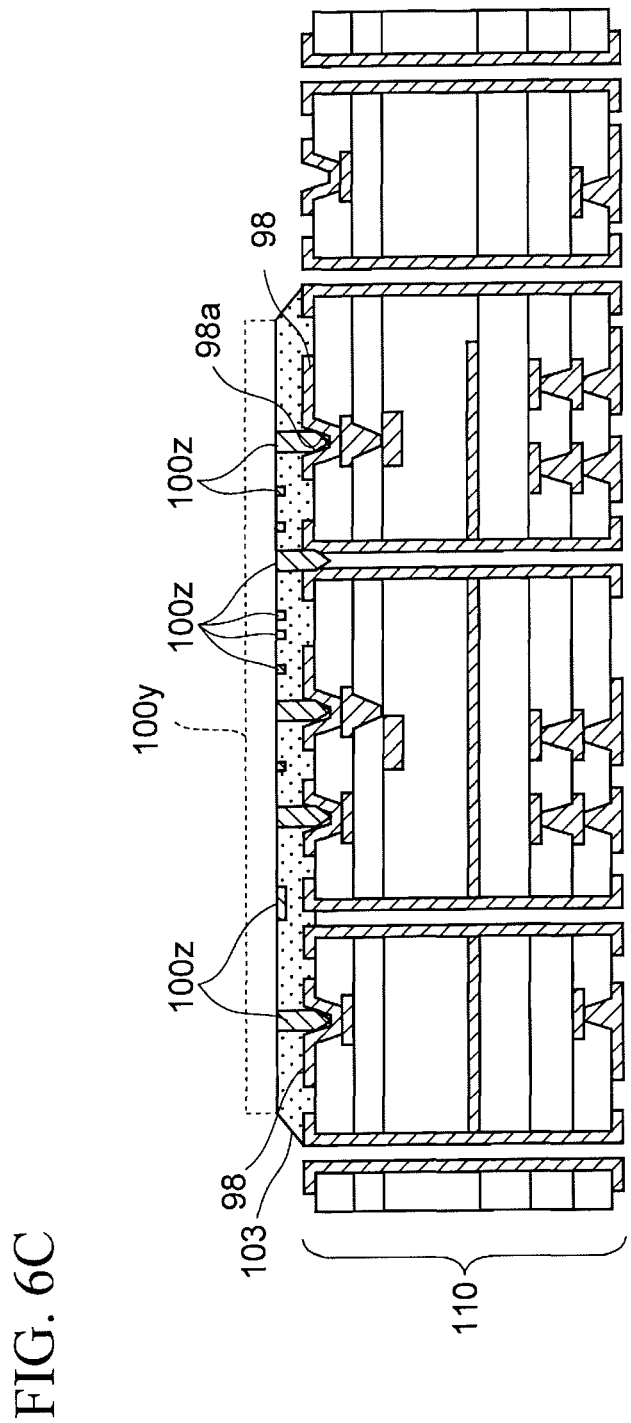

Subsequently, as illustrated in FIG. 6C, polishing, CMP, cutting by the use of a diamond bit, or grinding is performed on another major surface 100y of the conductor plate 100 until the surface of the resin layer 103 appears. Thereby the projection pattern 100w is left in the resin layer 103 as a conductor pattern 100z.

The plane layout of the conductor pattern 100z is not specifically limited. For example, the conductor pattern 100z may be formed above the ground pattern out of the circuit pattern 98 of the top layer, and the circuit pattern 98 and the conductor pattern 100z may be formed in a microstrip line structure.

Figure 6D:
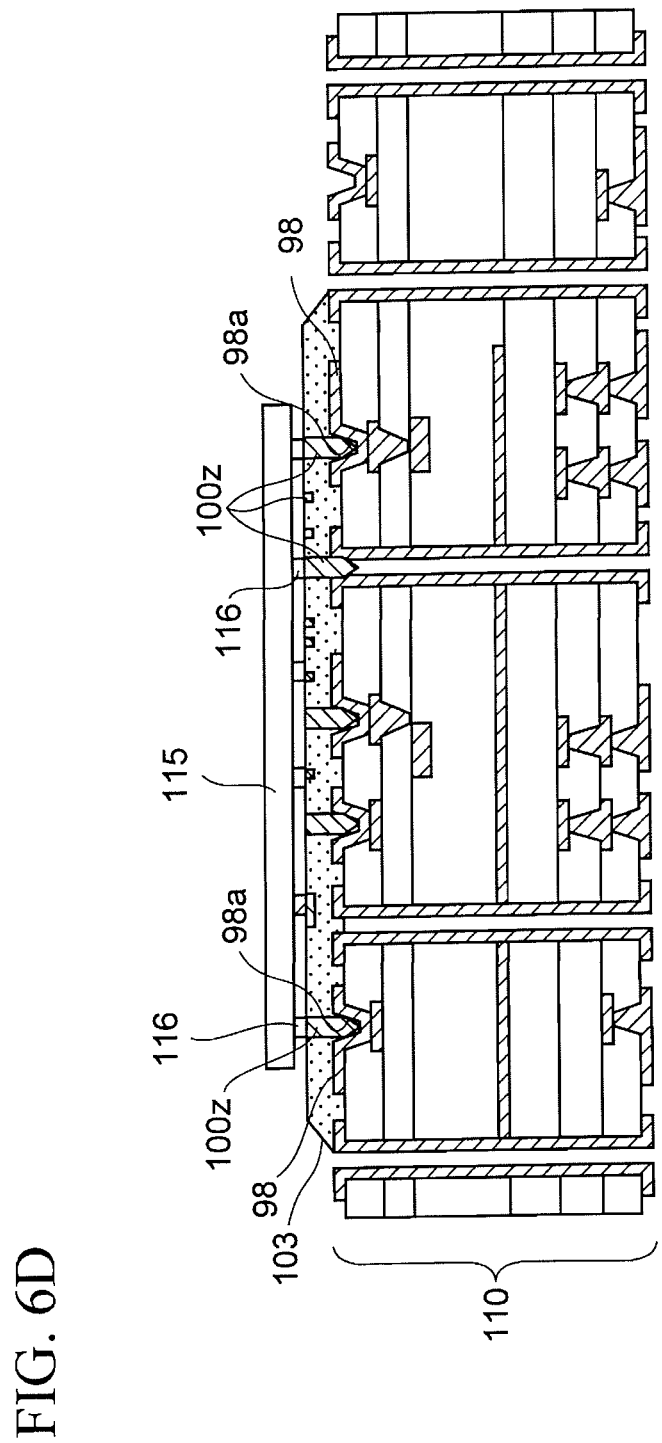

Subsequently, as illustrated in FIG. 6D, an external connection terminal 116 of a semiconductor device 115 is bonded to the conductor pattern 100z appearing on the resin layer 103. The external connection terminal 116 is formed of, for example, gold bumps which is bonded on the conductor pattern 100z by ultrasonic bonding.

Instead of using ultrasonic bonding, electrical connection may be used to electrically connect the external connection terminal 116 and the conductor pattern via a low melting point solder or an anisotropy conductive film.

Thus, the basic structure of the module in which the semiconductor device 115 is mounted on the circuit board 110 is completed.

In the present above-described embodiment, the conductor pattern 100z is formed using the projection pattern 100w of the conductor plate 100, then the semiconductor device 115 and the multilayered circuit substrate 110 are electrically connected via the conductor pattern 100z.

Thereby, even in the case where the arrangement of the external connection terminal 116 is changed depending on the type or generation of the semiconductor device 115, the layout of the conductor pattern 100z and the circuit pattern 98 of the top layer can be only redesigned according to the changed arrangement to mount the semiconductor device 115 on the multilayered circuit substrate 110. Accordingly, without making a major design change on the multilayered circuit substrate 110, various semiconductor devices 115 can be mounted on the multilayered circuit substrate 110.

The device mounted on the multilayered circuit substrate 110 is not limited to the semiconductor device 115, and may be an arbitrary electronic device, for example, a capacitor or a resistance element.

(7) Seventh Embodiment

In the above-described first to sixth embodiments, the step of forming the resin layer is followed by the step of pressing the conductor plate against relevant resin layer. On the other hand, in the present embodiment, the order of these steps is reversed as follows.

FIGS. 7A to 7D are cross-sectional views of the electronic component in the course of manufacturing thereof according to the present embodiment.

Figure 7A:
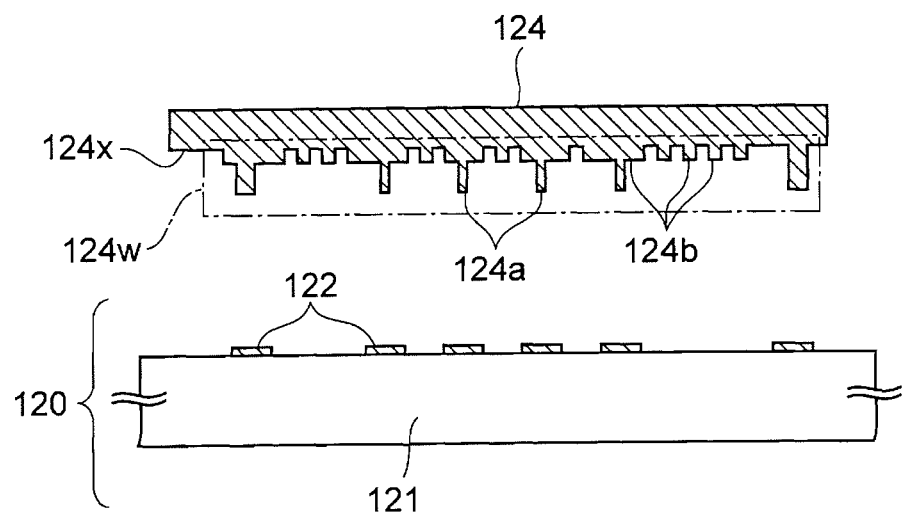
FIGS. 7A to 7D are cross-sectional views of an electronic component in the course of manufacturing thereof according to a seventh embodiment.

First, as illustrated in FIG. 7A, a circuit board 120 is prepared in a state such that an electrode pad 122 formed of, for example, a copper film having a thickness in a range of 5 to 10 µm is formed on the surface of a resin base material 121.

Instead of the resin base material 120, a build-up substrate, in which an insulating layer and a wiring layer are alternately formed multiple times, may be used.

The conductor plate 124 is then placed above the circuit board 120, and the circuit board 120 and the conductor plate 124 are aligned.

The conductor plate 124, on one major surface 124x, has a projection pattern 124w in which a first and second projection portions 124a, 124b in two levels with different heights are formed. In addition, as the material for the conductor plate 124, it is preferable to use copper or copper alloy which is useful for reduction in the wiring resistance.

Incidentally, a natural oxide film is formed on the surface of the projection pattern 124w or the electrode pad 122, and thus, it is preferable to remove the natural oxide film in the present step. In the case where the natural oxide film is a copper oxide film having a thickness of the order of 100 nm, the natural oxide film can be easily removed by exposing the surface of the conductor plate 124 or the electrode pad 122 to a dilute solution of organic acid such as acetic acid, or TMAH (tetramethylammonium hydroxide).

Figure 7B:
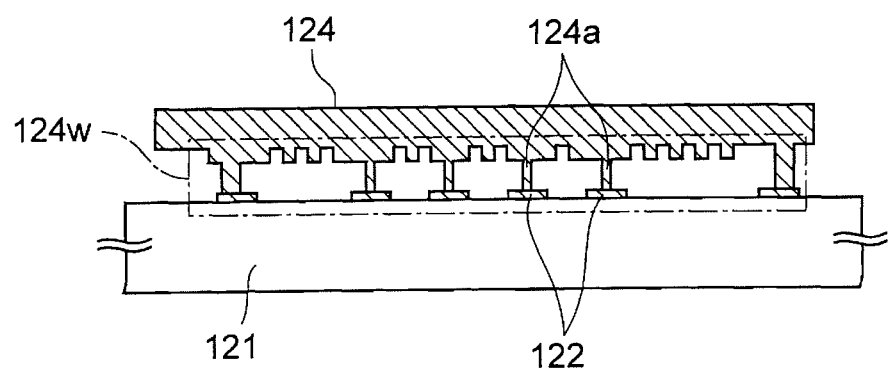

Next, as illustrated in FIG. 7B, the conductor plate 124 is pressed against the electrode pad 122 while heating the conductor plate 124 and the electrode pad 122 in an atmosphere of an inert gas such as nitrogen.

The heating temperature or pressure time at this point is not specifically limited. For example, in the present embodiment, the heating temperature is 200° C., the pressure is several 100 Pa, and the pressure time is several tens of minutes. In the case where the natural oxide film of the surface of the electrode pad 122 or the conductor plate 124 has a film-thickness of several nano-meters or less, the above conditions are used to metal-bond the first projection portion 124a and the electrode pad 122.

In addition, since the present step is performed in an atmosphere of an inert gas as mentioned above, the first projection portion 124a and the electrode pad 122 can be metal-bonded while suppressing the formation of a natural oxide film on the surface of the first projection portion 124a and the electrode pad 122.

Alternatively, instead of the inert gas, an atmosphere of a reducing gas may be used to perform the present step therein. Thereby, more favorable metal bonding can be obtained. For such reducing gas, for example, nitrogen gas in which formic acid (HCOOH) is mixed at a concentration of several tens of ppms to several percents is available.

Figure 7C:
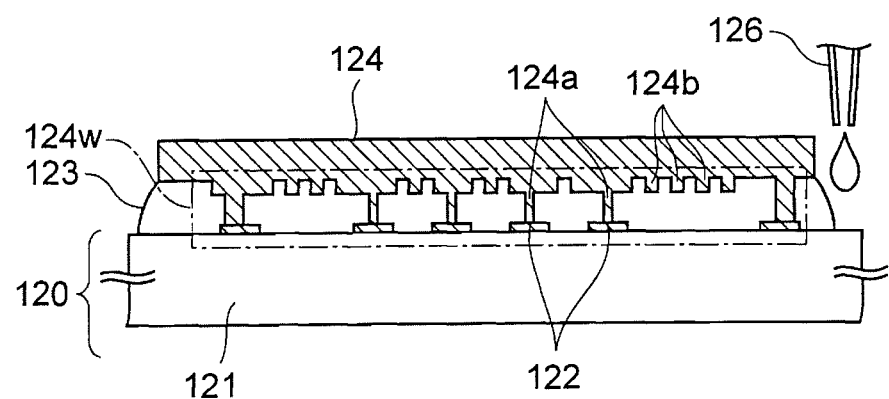

Subsequently, as illustrated in FIG. 7C, thermosetting resin is dropped from a nozzle 126. Then a capillary phenomenon is utilized to fill a space between the conductor plate 124 and the circuit board 120 with the thermosetting resin with no interstice, so that a resin layer 123 is formed.

The material for the resin layer 123 is not specifically limited. In the present embodiment, the resin layer 123 can be formed with any material selected from epoxy-based resin, silicone-based resin, cyanate-based resin, polyolefin-based resin, acrylic-based resin, and benzocyclobutene.

Subsequently, the resin 123 is heated to be cured.

Figure 7D:
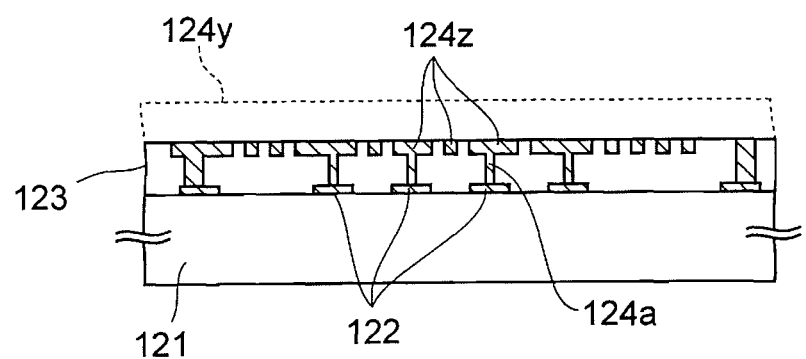

Next, as illustrated in FIG. 7D, polishing, CMP, or cutting by the use of a diamond bit is performed on another major surface 124y of the conductor plate 124 until the surface of the resin layer 123 appears. Thereby the projection pattern 124w is left in the resin layer 123 as a conductor pattern 124z.

The portion corresponding to the first protrusion 124a in the conductor pattern 124z serves as a conductor plug, and the portion corresponding to a second protrusion 124b serves as a wiring.

Thus, the main steps in the method of manufacturing the electronic component according to the present embodiment are completed.

According to the present embodiment, as illustrated in FIG. 7B, the conductor plate 124 and the electrode pad 122 are metal-bonded before the formation of the resin layer 123. Consequently, no space is left for the resin layer 123 between the conductor plate 124 and the electrode pad 122, thereby it is possible to improve the reliability of the connection between the conductor plate 124 and the electrode pad 122.

(8) Eighth Embodiment

In the present embodiment, a conductor plate is used for connecting a plurality of circuit boards as described below.

FIGS. 8A to 8E are cross-sectional views of the electronic component in the course of manufacturing thereof according to the present embodiment.

First, as illustrated in FIG. 8A, a first circuit board 131 and a second circuit board 132 both serving as an underlying substrate are prepared in a form as being arranged in a horizontal plane.

The respective circuit boards 131, 132 are provided with a resin base material 130 in which a via hole 130a is formed, and an electrode pad 138 formed of a patterned copper film or the like is formed on the inner surface of the via hole 130a and the upper surface of the resin base material 130.

Then a conductor plate 140 having a projection pattern 140w on one major surface 140x is placed so as to overlap with the joint between these substrates 131, 132. The projection pattern 140w has a protrusion 140a and a projection portion 140c in a wiring shape, and the protrusion 140a is disposed above the via hole 130a by aligning the conductor plate 140 with the circuit boards 131, 132.

While the material for the conductor plate 140 is not limited, it is preferable to use copper or copper alloy which is useful for reduction in the wiring resistance as the material for the conductor plate 34.

Next, as illustrated in FIG. 8B, the protrusion 140a is fitted into a recess portion 138a which is formed by reflecting the via hole 130a on the surface of each electrode pad 138. Thereby, the respective circuit boards 131, 132 are mechanically bonded to each other by the conductor plate 140.

Figure 8C:
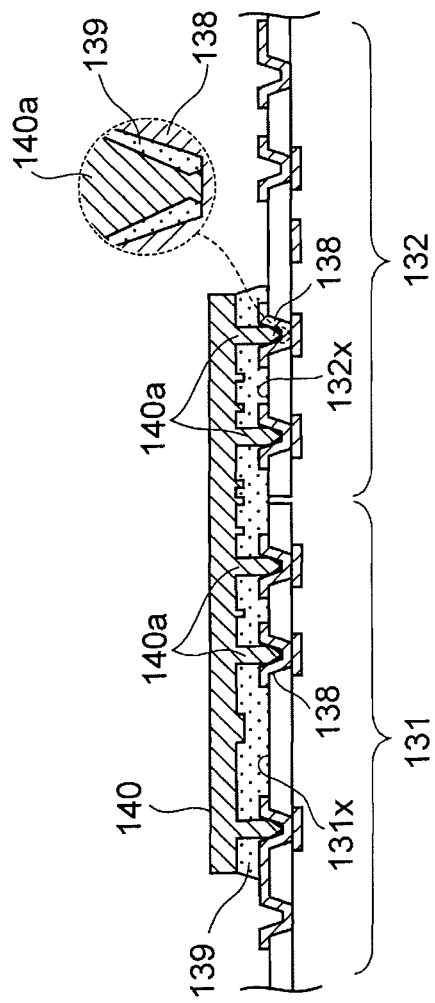

Next, as illustrated in FIG. 8C, using capillary phenomenon, thermosetting resin is filled in a space between respective major surfaces 131x, 132x of the circuit boards 131, 132, and the conductor plate 140 with no interstice, so that a resin layer 139 is formed.

Thermosetting resin available for use as the resin layer 139 includes, for example, epoxy-based resin, silicone-based resin, cyanate-based resin, polyolefin-based resin, acrylic-based resin, and benzocyclobutene.

Subsequently, the resin layer 139 is heated to be cured.

At this point, as illustrated by the dotted line circle in FIG. 8C, it is preferable to deform the tip of the protrusion 140a in the lateral direction by pressing the protrusion 140a against the electrode pad 138 before the formation of the resin layer 139. In this manner, the deformed protrusion 140a can prevent the conductor plate 140 from being separated from the resin layer 139. Furthermore, the deformed tip of the protrusion 140a can increase the contact area between the electrode pad 138 and the protrusion 140a, and can reduce the contact resistance between the protrusion 140a and the electrode pad 138.

Figure 8D:
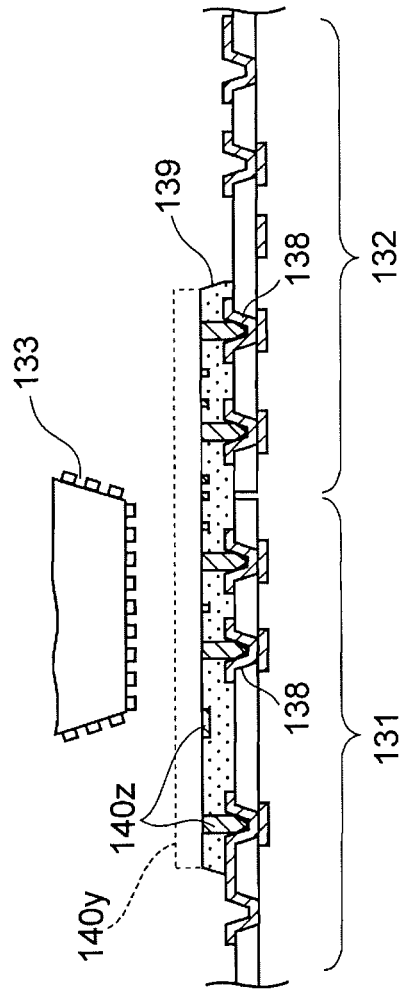

Subsequently, as illustrated in FIG. 8D, another major surface 140y of the conductor plate 140 is polished by a grind stone 233 until the surface of the resin layer 139 appears. Thereby the projection pattern 140w (see FIG. 8A) is left in the resin layer 139 as a conductor pattern 140z. Instead of polishing, CMP or grinding may be used to perform the present step.

Figure 8E:
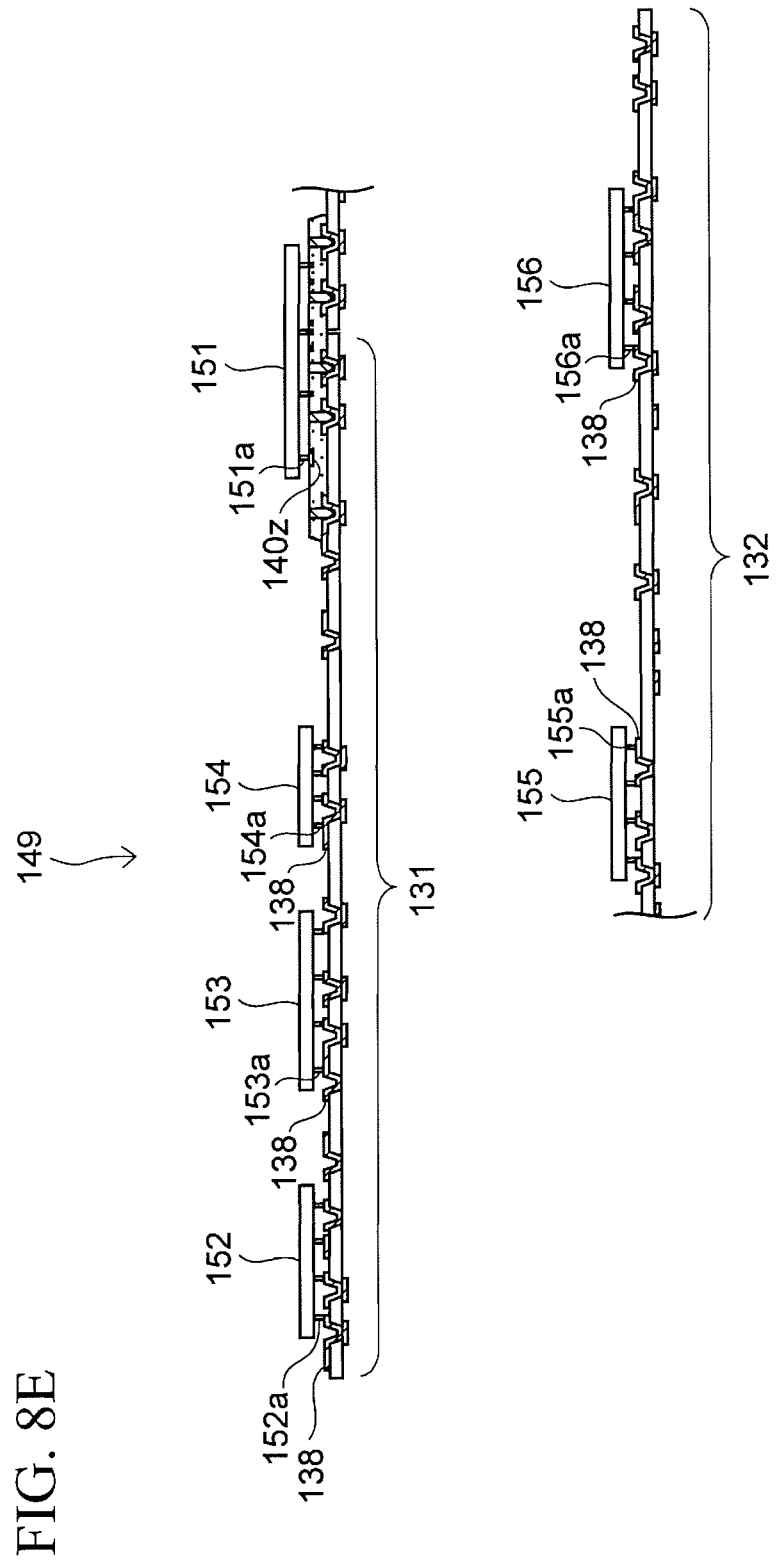

Subsequently, as illustrated in FIG. 8E, the first semiconductor device 154 is flip-chip connected to the above-mentioned conductor pattern 140z, while the second to sixth semiconductor devices 152 to 156 are flip-chip connected to the electrode pads 138 of the respective circuit boards 131, 132.

Among them, the first semiconductor device 151 is electrically and mechanically connected to the conductor pattern 140z via a first external connection terminal 151a such as a solder bump. In addition, the second to sixth semiconductor devices 152 to 156 are electrically and mechanically connected to the electrode pads 138 via a second to sixth external connection terminal 152a to 156a such as a solder bump.

Thus, the basic structure of electronic component 149 according to the present embodiment is completed.

According to the above-described present embodiment, as illustrated in FIG. 8D, a novel structure can be obtained in a form such that two circuit boards 131 and 132 are connected together due to the conductor pattern 140z and the resin layer 139 which are formed using the conductor plate 140. According to the present embodiment, the electronic component 149 in various outer sizes can be obtained by connecting the circuit boards 131 and 132 in different types.

Note that, although the resin layer 139 is formed as illustrated in FIG. 8C after the circuit boards 131, 132 are connected to the conductor plate 140 as illustrated in FIG. 8B in the above case, the present embodiment is not limited to this procedure.

Figures 9A, 9B:
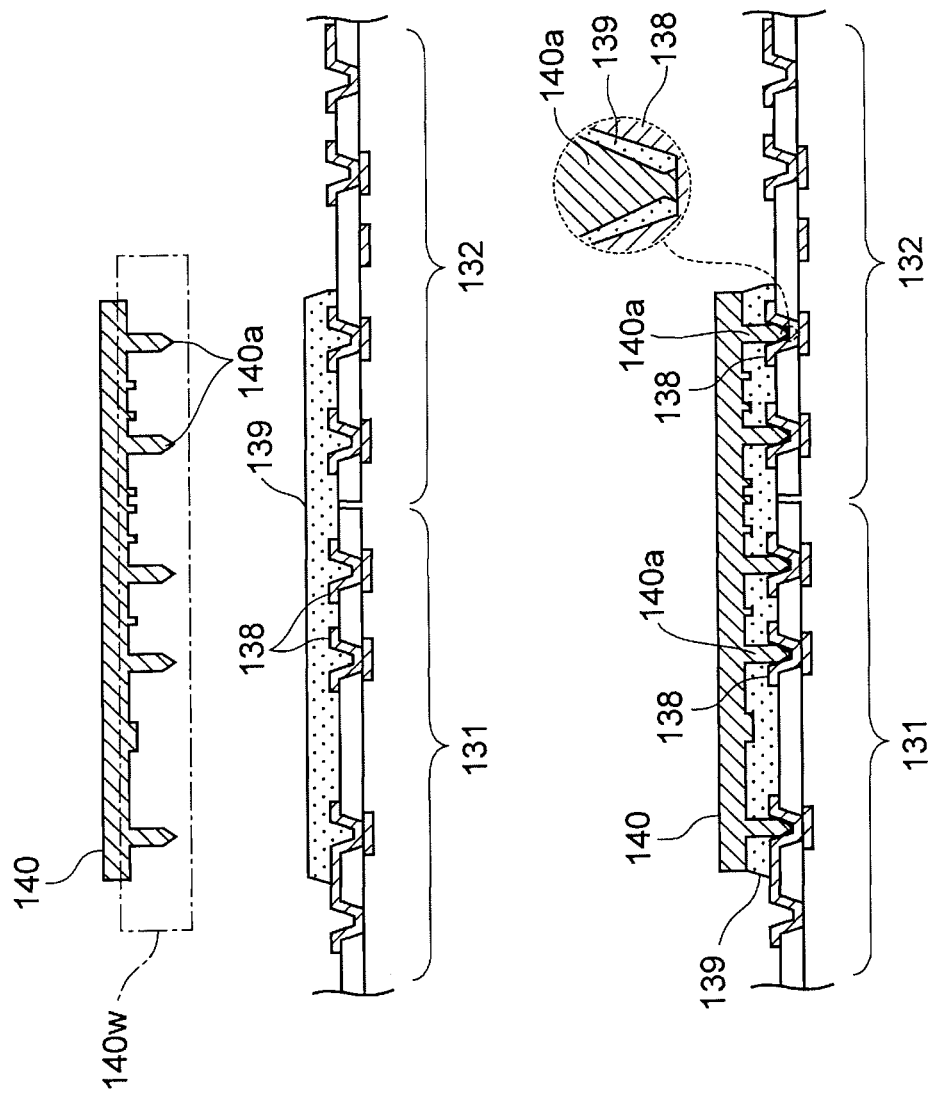
FIGS. 9A, 9B are cross-sectional views illustrating another method of manufacturing the electronic component according to the eighth embodiment.

FIGS. 9A and 9B are cross-sectional views illustrating another method of manufacturing the electronic component according to the present embodiment.

In this example, the resin layer 139 is previously formed as illustrated in FIG. 9A, then later, the projection pattern 140w of the conductor plate 140 is embedded in the resin layer 139 as illustrated in FIG. 9B. Even in this manner, the circuit boards 131 and 132 in different types can be connected, and thereby the electronic component 149 in various outer sizes can be obtained.

Moreover, in this case as well, as illustrated by the dotted line circle, the protrusion 140a is pressed against the electrode pad 138 to be deformed in the lateral direction. Thereby, the conductor plate 140 can be prevented from being separated from the resin layer 139, and the contact resistance between the protrusion 140a and the electrode pad 138 can be reduced.

The number of circuit boards 131, 132 to be connected is not limited to two. So, three or more circuit boards may be connected to each other via the conductor plate 140.

(9) Ninth Embodiment

In the present embodiment, description is carried out for an electronic components capable of improving the reliability of the connection between the conductor pattern obtained from the conductor plate and the solder bump of the semiconductor device.

FIGS. 10A to 10F are cross-sectional views of the electronic component in the course of manufacturing thereof according to the present embodiment. In these figures, the same elements as described in the sixth embodiment are labeled with the same reference symbols as in the sixth embodiment, and hereinafter the description is omitted.

Figure 10A:
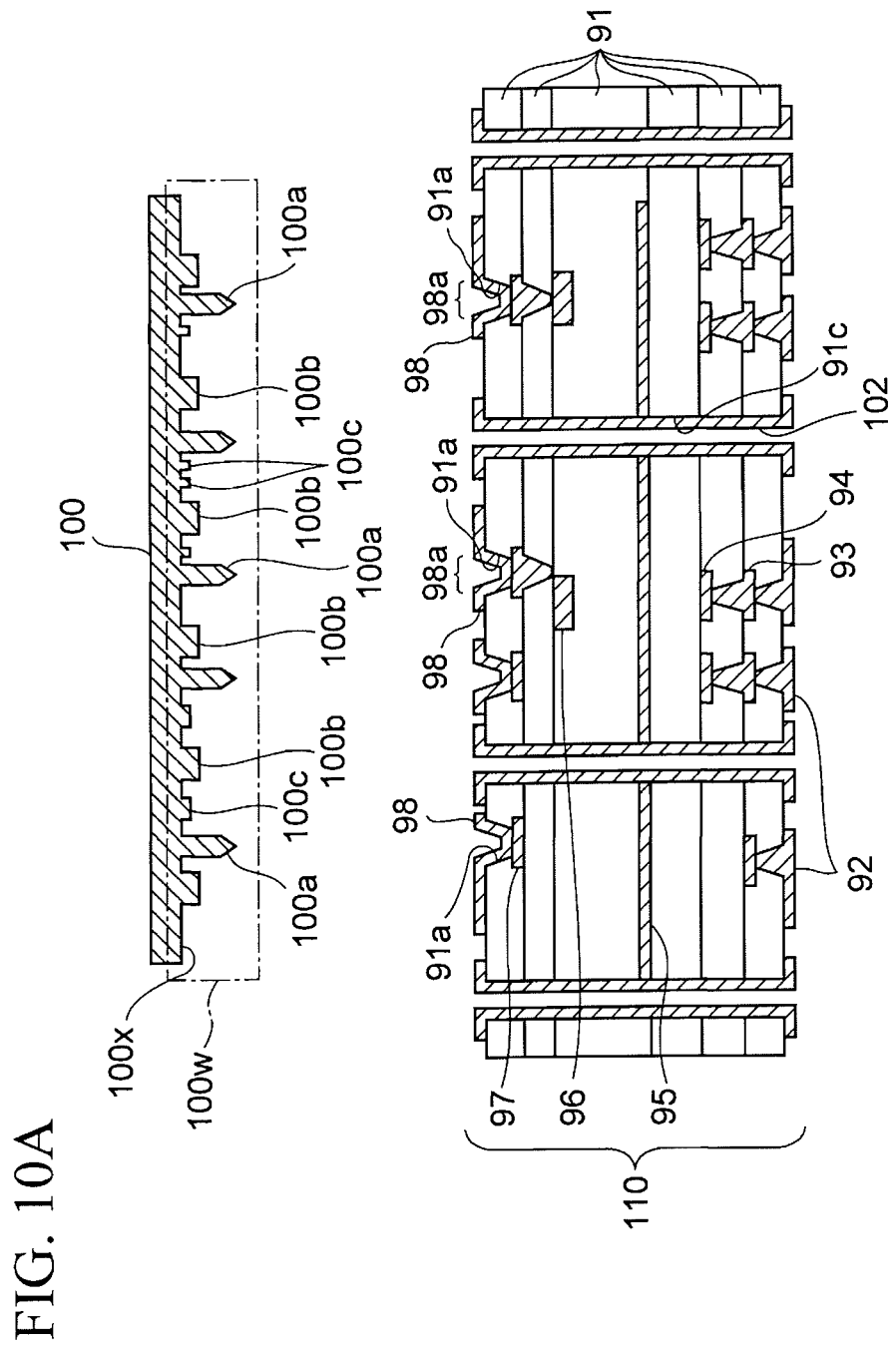
FIGS. 10A to 10F are a cross-sectional views of an electronic component in the course of manufacturing thereof according to a ninth embodiment.

First, as illustrated in FIG. 10A, the multilayered circuit substrate 110 and the conductor plate 100 are prepared. Among them, the conductor plate 100 has the projection pattern 100w formed on one major surface 100x thereof.

In the present embodiment, the projection pattern 100z has a first projection portion 100b and a second projection portion 100c in two levels with different heights in addition to the protrusion 100a (see FIG. 6A) described in the sixth embodiment.

Then the conductor plate 100 and the multilayered circuit substrate 110 are aligned so that the protrusion 100a is located above the via hole 91a.

Figure 10B:
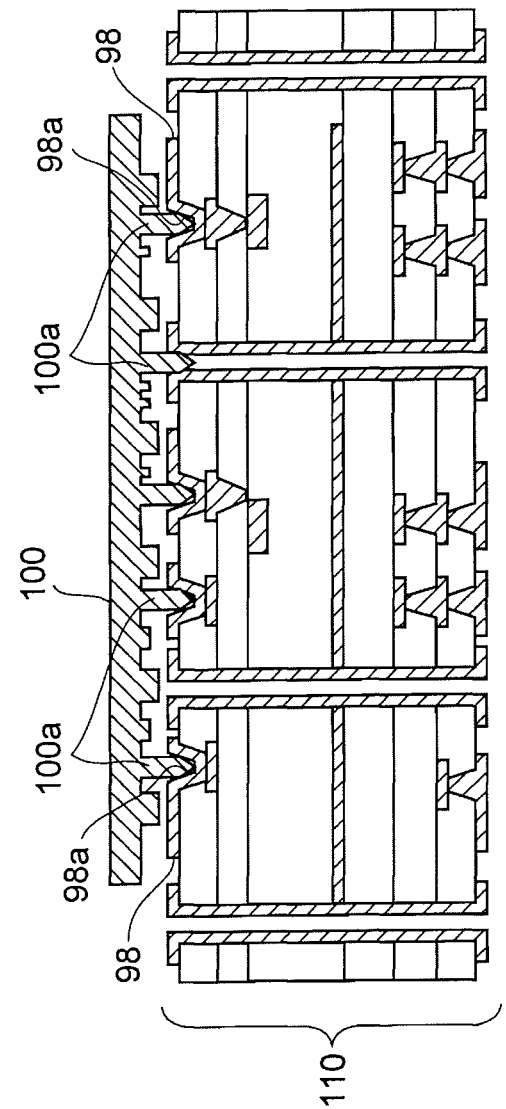

Next, as illustrated in FIG. 10B, the protrusion 100a is fitted into the recess portion 98a of the circuit pattern 98, which reflects the shape of the via hole 91a, to thereby fix the conductor plate 100 to the circuit board 110.

Figure 10C:
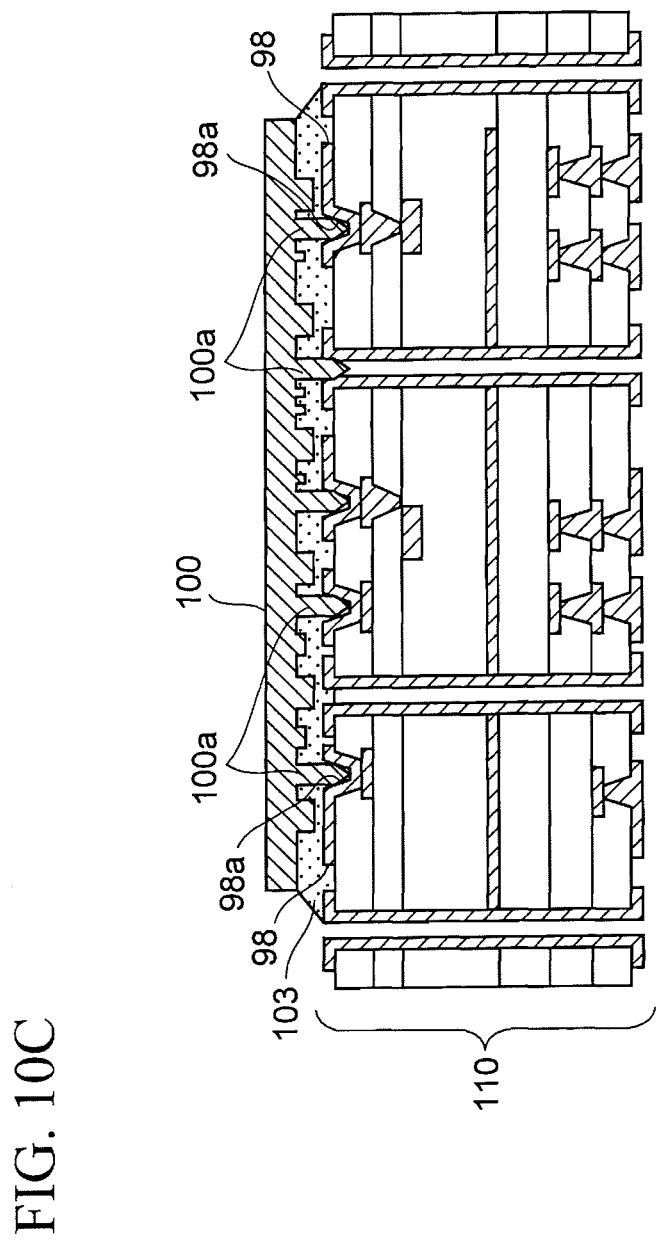

Subsequently, as illustrated in FIG. 10C, a capillary phenomenon is used to fill a space between the multilayered circuit substrate 110 and the conductor plate 100 with thermosetting resin with no interstice, so that the resin layer 103 is formed.

The material for the resin layer 103 is not specifically limited. In the present embodiment, For example, the resin layer 103 is formed with any material selected from epoxy-based resin, silicone-based resin, cyanate-based resin, polyolefin-based resin, acrylic-based resin, and benzocyclobutene.

Subsequently, the resin layer 103 is heated to be cured.

Figure 10D:
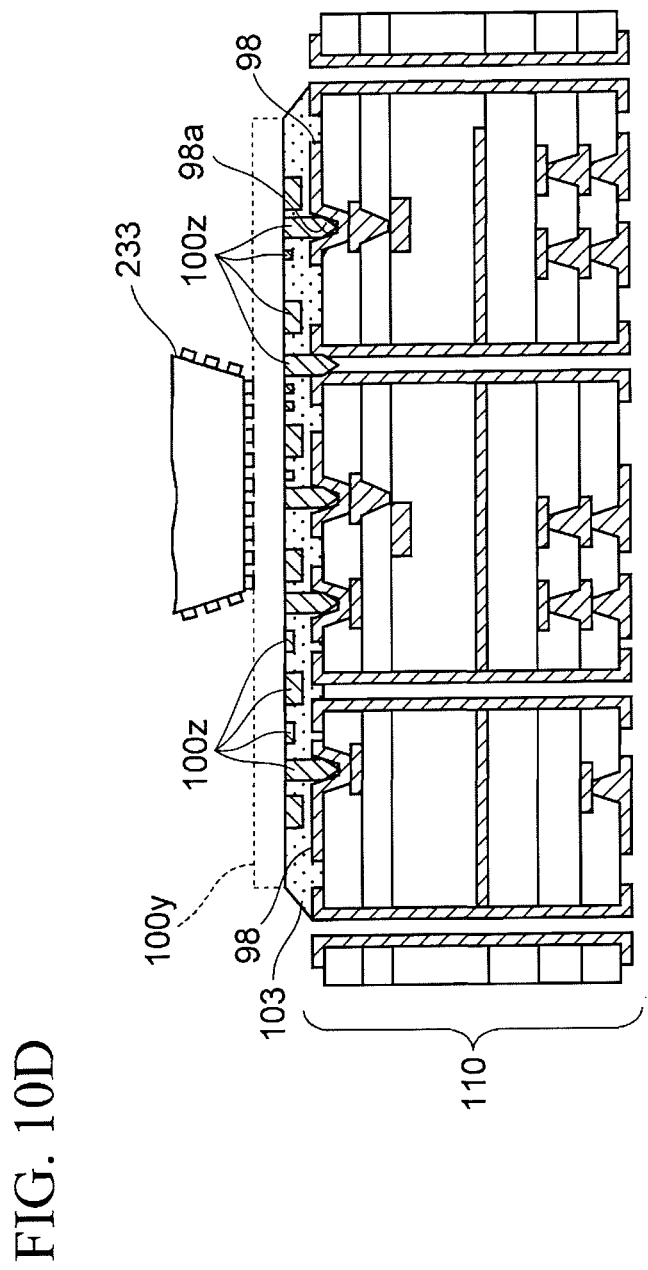

Next, as illustrated in FIG. 10D, another major surface 100y of the conductor plate 100 is polished by the grind stone 233 until the surface of the resin layer 103 appears. Thereby the projection pattern 100w is left in the resin layer 103 as the conductor pattern 100z. Instead of polishing, CMP or grinding may be used to perform the present step.

Subsequently, the step in which solder bumps of the semiconductor device are bonded to the conductor pattern 100z is performed. At the time, the polished surface immediately after polishing as described above is in a state where melted solder wets and spreads (wet-spread) easily. Consequently, when solder bumps are bonded on the conductor pattern 100z in this state, it is likely that adjacent conductor pattern 100z may be electrically short-circuited due to wet-spread solder. Moreover, since the solder wet-spreads in this manner, the amount of solder in the portion where a solder bump is made into contact with the conductor pattern 100z becomes insufficient. For this reason, it is likely that the connection between the solder bump and the conductor pattern 100z becomes electrically open.

Figure 10E:
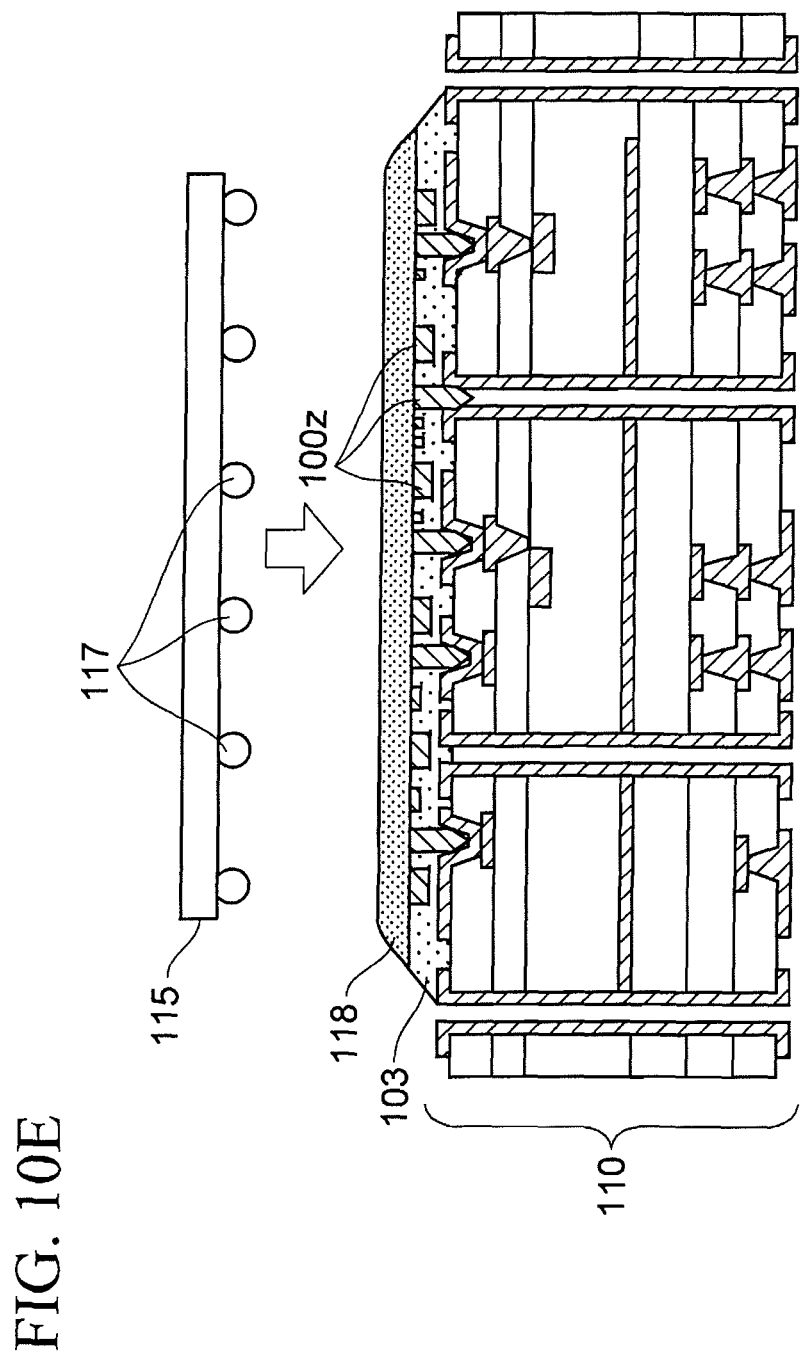

In order to prevent such wet-spreading of solder, in the next step, a coating film 118 of thermosetting resin is formed so as to cover each upper surface of the resin layer 103 and the conductor pattern 100z as illustrated in FIG. 10E. Although the material for the thermosetting resin is not specifically limited, it is preferable to use adhesive thermosetting resin from the later-described viewpoint of improving the adhesive strength between the semiconductor device and the multilayered circuit substrate 110. As the thermosetting resin, for example, epoxy-based resin, silicone-based resin, cyanate-based resin, polyolefin-based resin, acrylic-based resin, and benzocyclobutene are available.

Then in a state where the coating film 118 is formed, the semiconductor device 115 is prepared above the multilayered circuit substrate 110, and then, the semiconductor device 115 is lowered toward the multilayered circuit substrate 110. The semiconductor device 115 has protrusion electrodes 117 composed of low melting point metal such as a solder bump, which are laid on the major surface thereof.

Figure 10F:
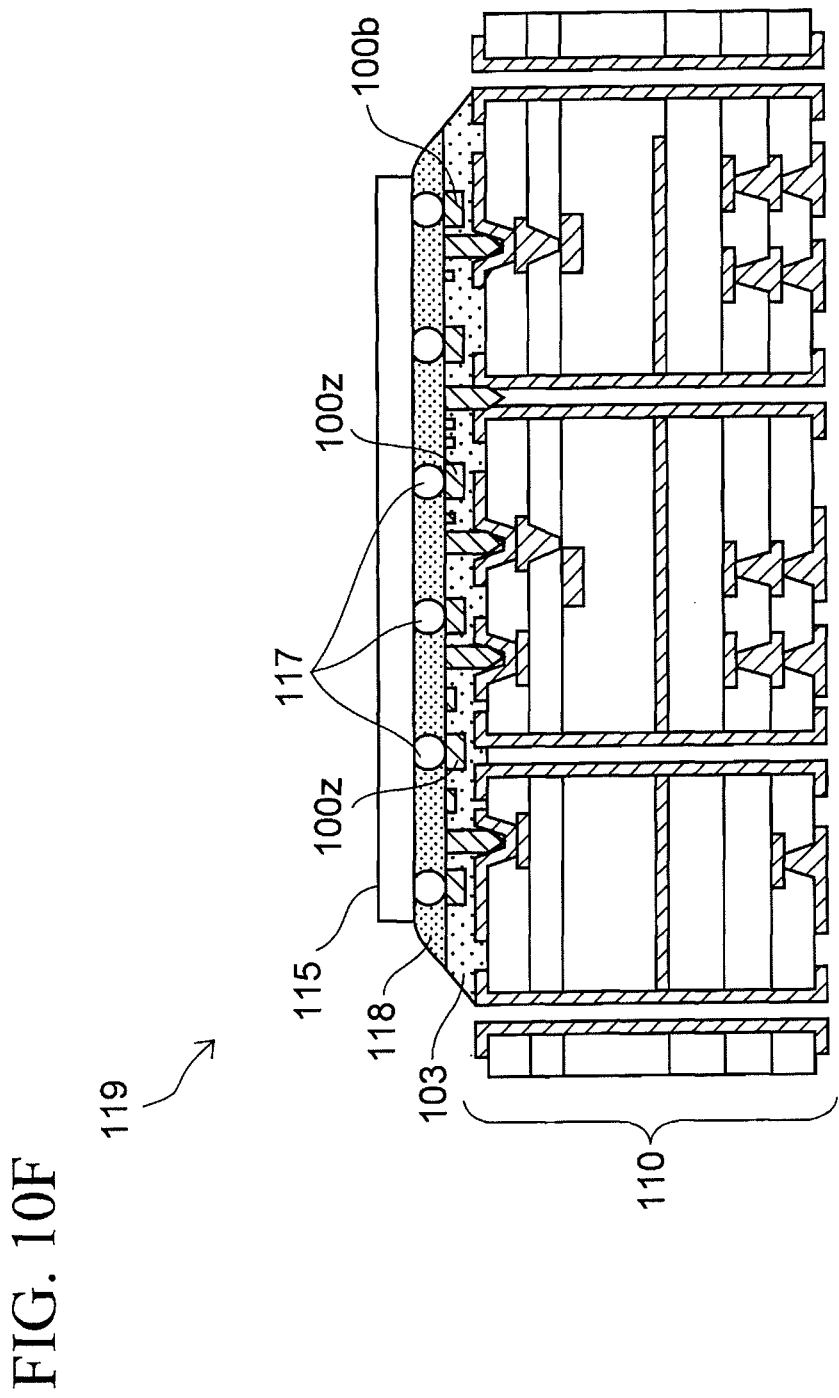

In this manner, as illustrated in FIG. 10F, the protrusion electrode 117 pushes away the coating film 118 and is made into contact with the conductor pattern 100z.

Then in this state, the coating film 118 and the protrusion electrode 117 are heated up to a temperature higher than the curing temperature of the coating film 118, and the melting point of the protrusion electrode 117. Thereby, the melted protrusion electrode 117 can be prevented by the coating film 118 from spreading out in the lateral direction, while the coating film 118 can be heated to be cured.

Subsequently, heating of the coating film 118 and the protrusion electrode 117 are stopped, and thus the melted protrusion electrode 117 is solidified. Then, the semiconductor device 115 is electrically and mechanically connected to the multilayered circuit substrate 110 via the protrusion electrode 117.

Thus, the basic structure of the electronic component 119 according to the present embodiment is completed.

As described above, in the present embodiment, the melted protrusion electrode 117 can be prevented by the coating film 118 from wet-spreading out. Thereby, it is possible to prevent adjacent conductor patterns 100z from being electrically short-circuited by the melted protrusion electrode 117.

Furthermore, since the protrusion electrode 117 does not wet-spread, a lack in the amount of solder at the contact portion of the protrusion electrode 117 to the conductor pattern 100z can be avoided. Thereby, it is possible to reduce a risk that the connection between the protrusion electrode 117 and the conductor pattern 100z becomes electrically open.

Furthermore, the coating film 118, due to an adhesive property thereof, can reinforce the mechanical strength of the connection between the multilayered circuit substrate 110 and the semiconductor device 115.

Now, as described with reference to FIG. 10A, the projection pattern 100w serving as the base of the conductor pattern 100z has the first projection portion 100b and the second projection portion 100c with different heights. Such difference in the heights results in formation of two types of portions with different thicknesses in the conductor pattern 100z as follows.

Figure 11:
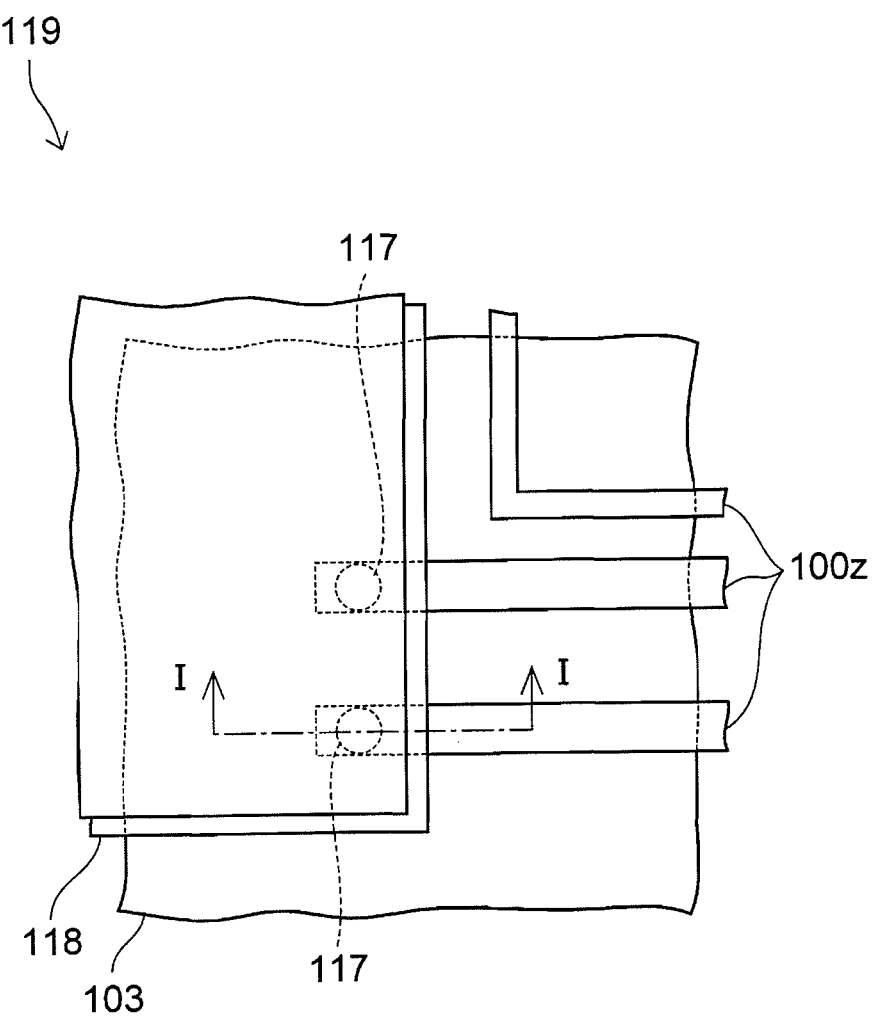
FIG. 11 is an enlarged plan view of the electronic device according to the ninth embodiment.
Figure 12:
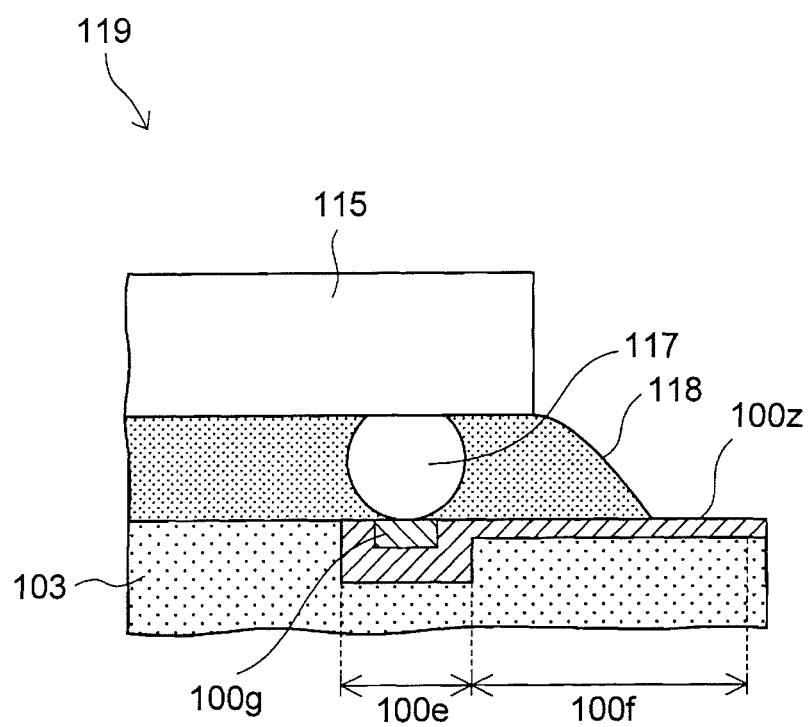
FIG. 12 is a cross-sectional view taken along the line I-I in FIG. 11.

FIG. 11 is an enlarged plan view of the electronic device, and FIG. 12 is a cross-sectional view taken along the line I-I in FIG. 11.

As illustrated in FIG. 12, the conductor pattern 100z has a first portion 100f and a second portion 100e. Between them, the second portion 100e is formed due to the first projection portion 100b of the projection pattern 100w. The second portion 100e is thicker than the first portion 100f formed due to the second projection portion 100c.

In the present embodiment, the protrusion electrode 117 is bonded on the second portion 100e of such conductor pattern 100z.

The protrusion electrode 117 includes low melting point metal such as solder. Thereby, a compound layer 100g made from a compound of the low melting point metal and the conductor pattern 100z is formed in the second portion 100e.

The compound layer 100g having a crystal structure different from that of the surrounding conductor pattern 100z contracts during its formation process. For this reason, a crack tends to be formed between the compound layer 100g and the surrounding conductor patterns 100z.

Even when such crack is formed, the formation position of the crack is in the second portion 100e which is immediately below the protrusion electrode 117, and the second portion 100e is formed thicker than the first portion 100f. Thereby, even when a crack is formed, the second portion 100e is not divided in a perpendicular direction to the substrate due to the crack, and thus the conductor pattern 100z is not disconnected due to the crack.

Figure 13:
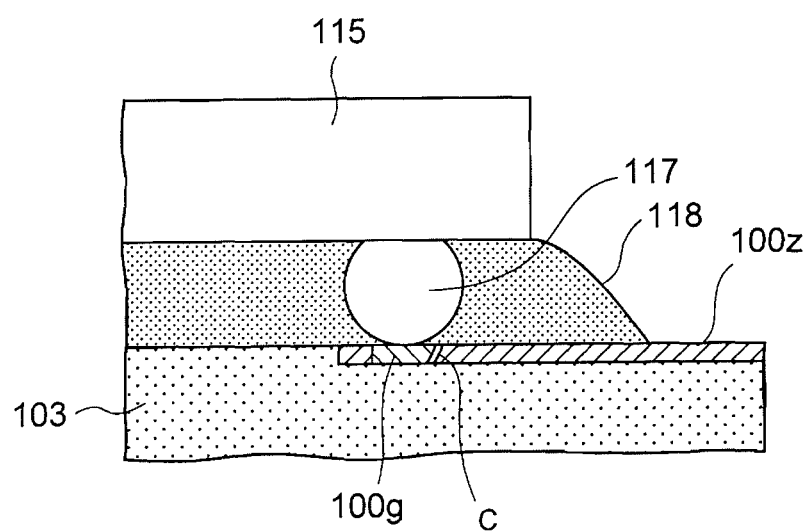
FIG. 13 is a cross-sectional view of an electronic device according to a comparative example.

In contrast, FIG. 13 is a cross-sectional view of the electronic device according to a comparative example.

In this comparative example, the second portion 100e is not formed in the conductor pattern 100z, but the conductor pattern 100z is formed as thin as the above-mentioned first portion 100f.

In this case, a crack C is formed in the conductor pattern 100z, resulting from the difference in respective crystal structures between the compound layer 100g and the surrounding conductor pattern 100z. The conductor pattern 100z according to the present example is formed as thin as the first portion 100f as described above. Thus, the crack C crosses the conductor pattern 100z in the perpendicular direction to the substrate to cause disconnection of the conductor pattern 100z.

In contrast, in the present embodiment, the second portion 100e having a thick film is formed as described above, disconnection of the conductor pattern 100z resulting from such crack can be prevented.

(10) Tenth Embodiment

In the present embodiment, a method of manufacturing the mold of the conductor plate described in the first to sixth embodiments is described.

First Example

The present example relates to a method of manufacturing the mold of the conductor plate 14 having the projection portions 14a, 14b in two levels with different heights as illustrated in FIG. 1A.

FIGS. 14A to 14J are cross-sectional views of the mold of the conductor plate in the course of manufacturing thereof.

Figure 14A:
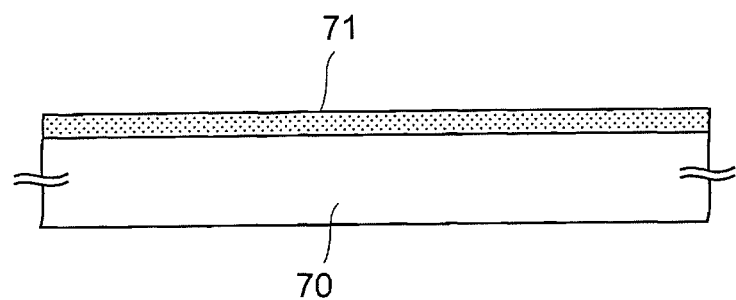
FIGS. 14A to 14J are cross-sectional views of the mold of a conductor plate in the course of manufacturing thereof according to a first example of a tenth embodiment.

In order to fabricate the mold, first as illustrated in FIG. 14A, a first photoresist 71 is coated on the entire upper surface of a silicon substrate 70, and then is baked to be set in a semi-cured state.

Figure 14B:
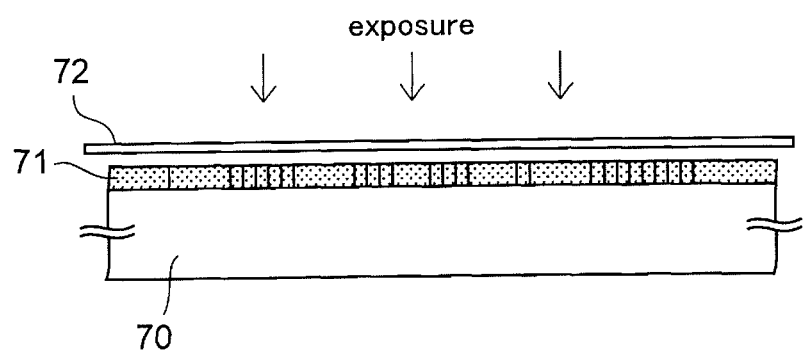

Next, as illustrated in FIG. 14B, a first exposure mask 72 having a mask pattern (not illustrated) formed of light-shielding film such as a chromium film is placed above the silicon substrate 70. Then the first photoresist 71 is irradiated with exposure light through the first exposure mask 72 and thereby exposed.

Instead of placing the first exposure mask 72 above the silicon substrate 70, an exposure device such as a stepper may be used to expose the first photoresist 71.

Figure 14C:
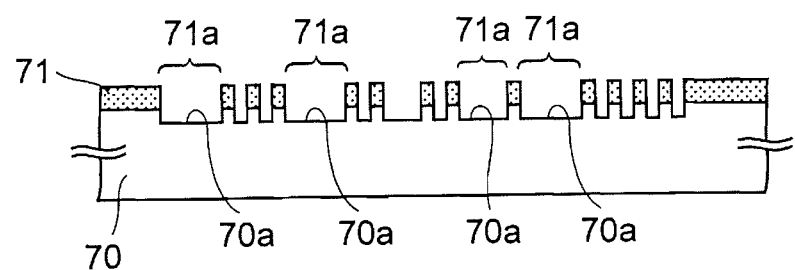

Next, as illustrated in FIG. 14C, the first photoresist 71 is developed to form windows 71a, and then through the windows 71a the silicon substrate 70 is dry-etched by RIE (Reactive Ion Etching). Thereby the first grooves 70a are formed in the silicon substrate 70.

Although the condition for the dry etching is not specifically limited, a mixed gas of a reactive gas and an inert gas is used as an etching gas in the present embodiment. Among them, the available reactive gas is any fluorine based gas selected from $F_2$, $SF_6$, $CF_4$, and $C_4F_8$. Alternatively, $Cl_2$ or $H_2$ may be used as the reactive gas. In addition, an available inert gas is, for example, argon gas.

Instead of such dry etching, wet etching may be performed using an etching solution such as fluoric acid or KOH.

After the etching is completed, the first photoresist 71 is removed.

Figure 14D:
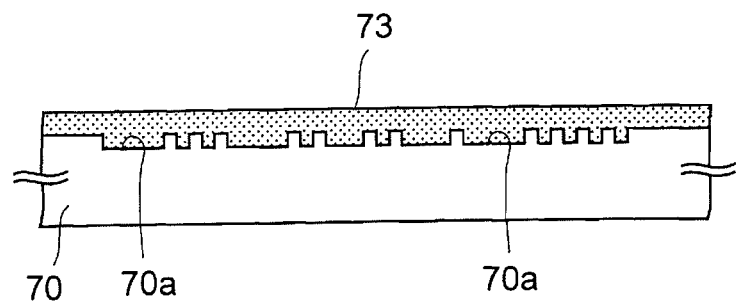

Next, as illustrated in FIG. 14D, a second photoresist 73 is formed on the entire upper surface of the silicon substrate 70, and then the second photoresist 73 is baked to be set in a semi-cured state.

Figure 14E:
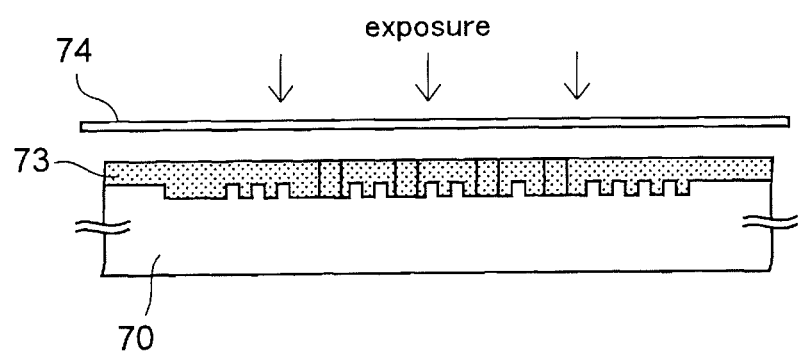

Subsequently, as illustrated in FIG. 14E, a second exposure mask 74 is placed above the silicon substrate 70, and then the second photoresist 73 is irradiated with exposure light through the second exposure mask 74. Thereby, the mask pattern (not illustrated) formed of light-shielding film such as a chromium film on the second exposure mask 74 is projected on the second photoresist 73, and the second photoresist 73 is exposed.

The exposure may be performed using an exposure device such as a stepper.

Figure 14F:
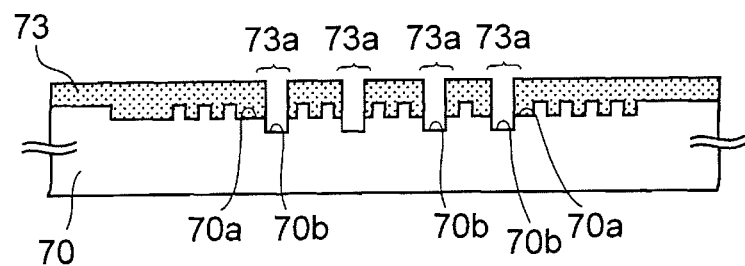

Subsequently, as illustrated in FIG. 14F, the second photoresist 73 is developed to form windows 73a, then through the windows 73a the silicon substrate 70 is dry-etched by RIE. Thereby, a second groove 70b deeper than the first groove 70a is formed in the silicon substrate 70.

The etching gas used in the etching is a mixed gas of a reactive gas and an inert gas similarly to the case of forming the first groove 70a. The available reactive gas is any fluorine based gas selected from $F_2$, $SF_6$, $CF_4$, and $C_4F_8$, otherwise $Cl_2$ or $H_2$. And the available inert gas, for example, is argon gas.

Figure 14G:
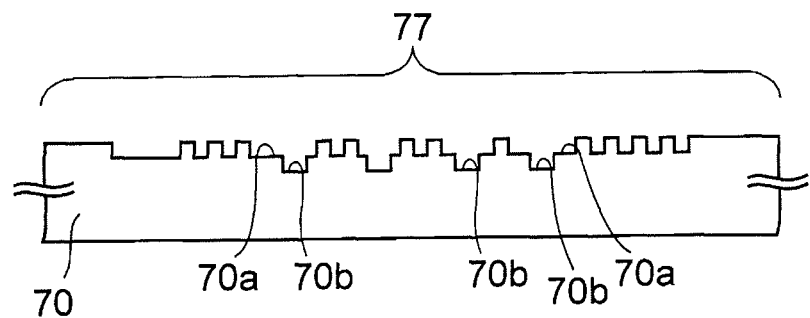

After the etching is completed, the second photoresist 73 is removed to obtain a master mold 77 as illustrated in FIG. 14G.

Figure 14H:
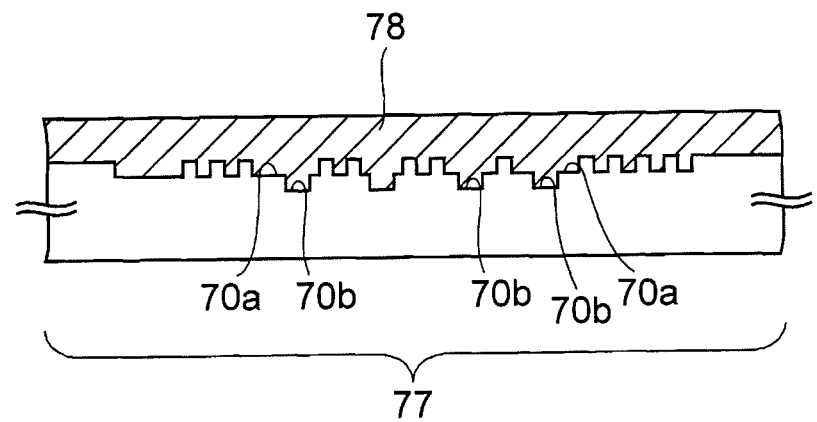

Next, as ilustrated in FIG. 14H, a metal layer is formed on the master mold 77 so as to embed the first and second grooves 70a, 70b. Thereby a first liner mold 78 formed of the metal layer is formed. The metal layer is, for example, a nickel layer formed by electrolysis plating.

Figure 14I:
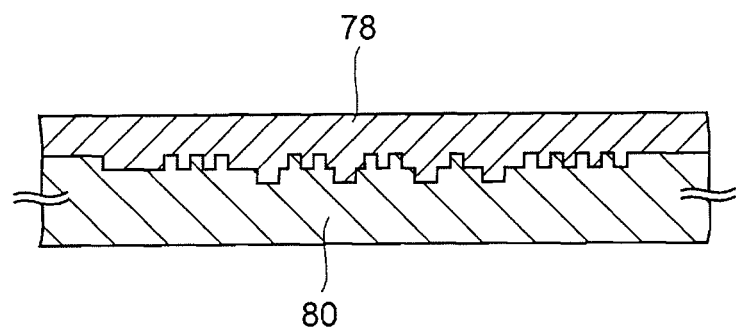

After the first liner mold 78 is removed from the master mold 77, the first liner mold 78 is molded with a resin as illustrated in FIG. 14I. Thereby a second liner mold 80 made of the resin is obtained. In order to fabricate the second liner mold 80, molding by nickel electroforming may be performed instead of molding with the resin.

Figure 14J:
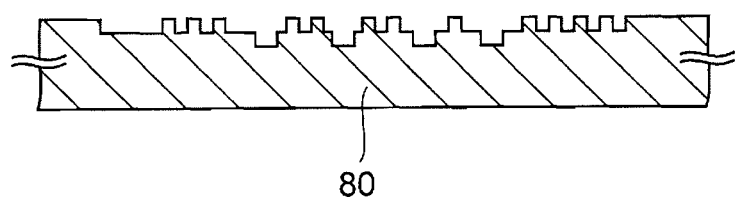

Subsequently, as illustrated in FIG. 14J, the second liner mold 80 is removed from the first liner mold 78.

Thus, the second liner mold 80 for forming the conductor plate 14 (see FIG. 1A) is completed.

For the fabrication of the conductor plate 14, for example, electroless copper plating and electrolytic copper plating are applied to the surface of the second liner mold 80 in this order. Then the relevant plating films are removed from the second liner mold 80, thereby the conductor plate 14 made of copper can be fabricated.

Further the single second liner mold 80 can be used to fabricate a plurality of conductor plates 14 having the same shape and quality, thereby it is possible to mass-produce the conductor plate 14 at a low cost.

Second Example

The present example relates to a method of manufacturing the mold of the conductor plate 34 having the protrusion 34a of cone-like tip as illustrated in FIG. 3C.

FIGS. 15A to 15E are cross-sectional views of the mold of the conductor plate in the course of manufacturing thereof.

Figure 15A:
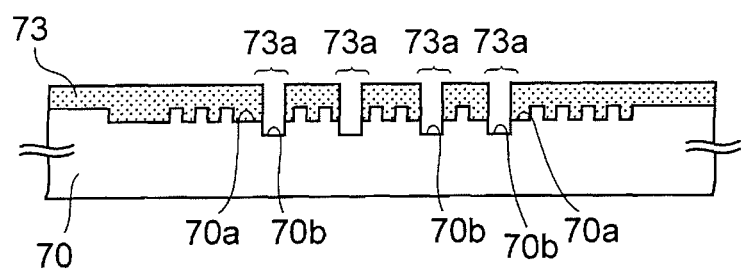
FIGS. 15A to 15E are cross-sectional views of the mold of a conductor plate in the course of manufacturing thereof according to a second example of the tenth embodiment.

In order to fabricate the mold, first, the steps in FIGS. 14A to 14F described in the first example are performed to form the first and second grooves 70a, 70b in the silicon substrate 70 as illustrated in FIG. 15A.

Figure 15B:
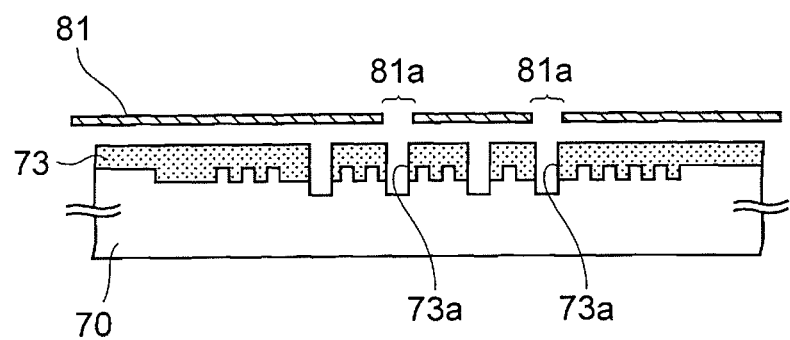

Next, as illustrated in FIG. 15B, a metal mask 81 having openings 81a is placed above the second photoresist 73. Then the silicon substrate 70 and the metal mask 81 are aligned with each other so that the opening 81a is located above the window 73a of the second photoresist 73.

Figure 15C:
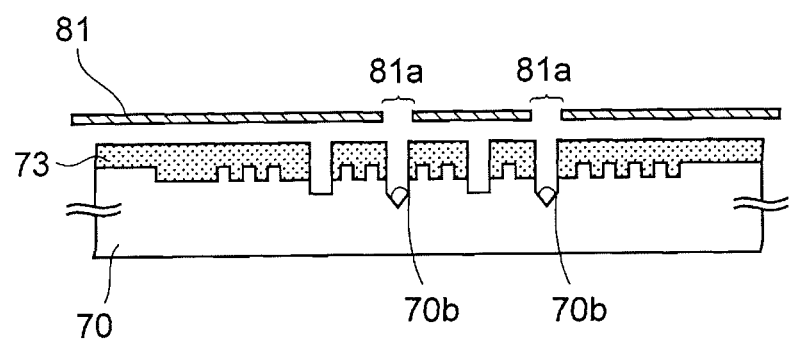

Subsequently, as illustrated in FIG. 15C, the silicon substrate 70 below the opening 81a of the metal mask 81 is dry-etched by RIE.

For the dry etching, a mixed gas of a reactive gas and an inert gas is used as an etching gas. Between them, the available reactive gas is any fluorine based gas selected from $F_2$, $SF_6$, $CF_4$, and $C_4F_8$. Alternatively, $Cl_2$ or $H_2$ may be used as a reactive gas. In addition, an available inert gas is, for example, argon gas.

In this case, when the flow rate of the reactive gas in the etching gas is reduced as compared with that during formation of the second groove 70b, the etching due to the reactive gas in the lateral direction is weakened, and thus the bottom of the second groove 70b can be etched in a tapered shape as illustrated in FIG. 15C.

Figure 15D:
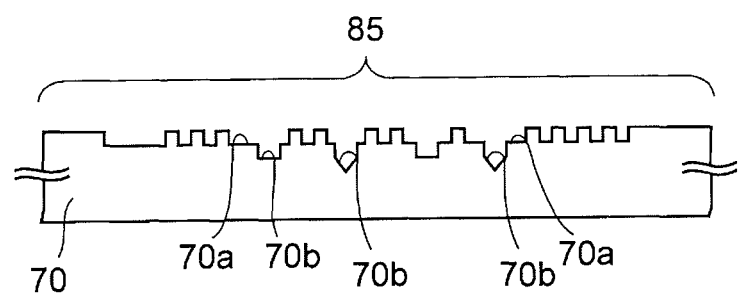

Subsequently, as illustrated in FIG. 15D, the second photoresist 73 is removed to complete the master mold 85.

Figure 15E:
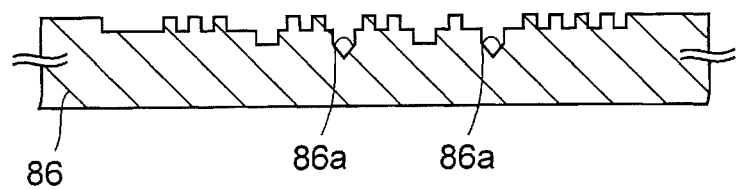

Subsequently, the steps in FIGS. 14H to 14J described in the first example are performed to complete a liner mold 86 for forming the conductor plate 34 (FIG. 3C), which is made of resin or which is formed by electroforming, as illustrated in FIG. 15E.

For the fabrication of the conductor plate 34, electroless copper plating and electrolytic copper plating are applied to the surface of the liner mold 86 in this order. Then the relevant plating films are removed from the liner mold 86, thereby the conductor plate 34 made of copper can be fabricated.

In the above-described method of manufacturing the liner mold 86, when the flow rate of the reactive gas in the etching step in FIG. 15C is reduced as compared with that as the second groove 70b is formed, thereby the bottom face of the groove 70b can be made in a tapered shape. This results in formation of a groove 86a corresponding to the protrusion 34a of cone-like tip (see FIG. 3C) in the liner mold 86 illustrated in FIG. 15E.

Third Example

In the present example, a resist pattern in two layers is utilized to fabricate the mold of the conductor plate 14 having the projection portions 14a, 14b in two levels with different heights as illustrated in FIG. 1A.

FIGS. 16A to 16I are cross-sectional views of the mold of the conductor plate in the course of manufacturing thereof.

Figure 16A:
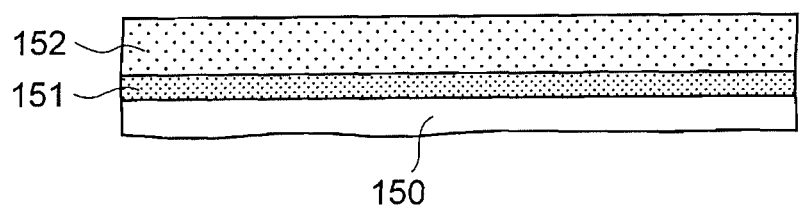
FIGS. 16A to 16I are cross-sectional views of the mold of a conductor plate in the course of manufacturing thereof according to a third example of the tenth embodiment.

First, as illustrated in FIG. 16A, a positive type, first resist layer 151 is formed on a silicon substrate 150, then the first resist layer 151 is baked to be set in a semi-cured state.

Next, a negative type, second resist layer 152 is further formed on the first resist layer 151. Then, the second resist layer 152 is baked to be set in a semi-cured state.

Figure 16B:
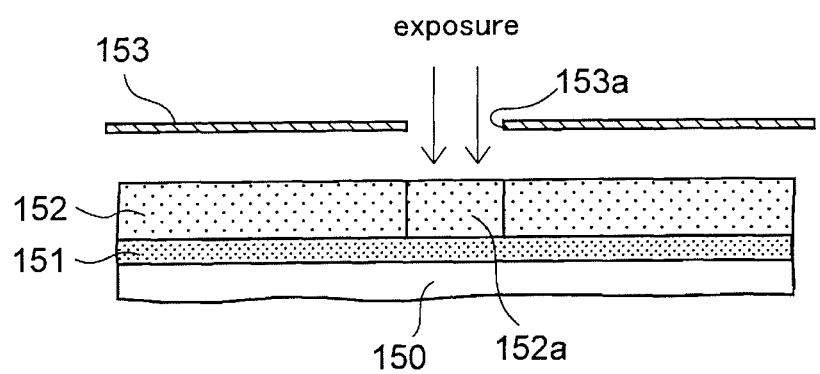

Next, as illustrated in FIG. 16B, the second resist layer 152 is irradiated with exposure light through a window 153a of a light-shielding, first exposure mask 153 so that exposed portion 152a is formed in the second resist layer 152.

Figure 16C:
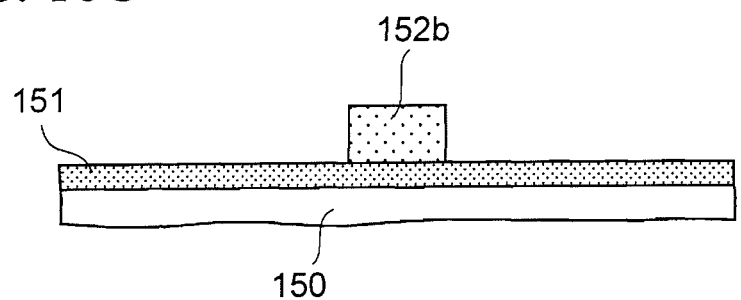

Subsequently, the portion of the second resist layer 152 other than the exposed portion 152a is removed by development. Thereby, an upper resist pattern 152b is formed on the first resist layer 151 as illustrated in FIG. 16C.

As a developing solution for the development, the developing solution which dissolves only the second unexposed resist layer 152 and leaves the first resist layer 151 undissolved is used. Accordingly, the first resist layer 151 remains on the silicon substrate 150 after the development.

Figure 16D:
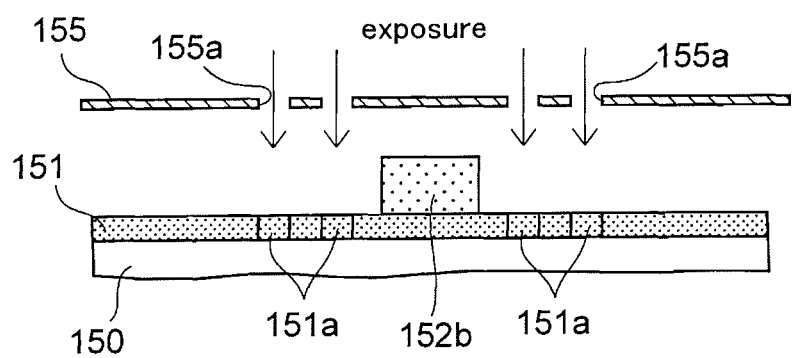

Next, as illustrated in FIG. 16D, the first resist layer 151 is irradiated with exposure light through a window 155a of a light-shielding, second exposure mask 155, thereby forming an exposed portion 151a in the first resist layer 151.

Figure 16E:
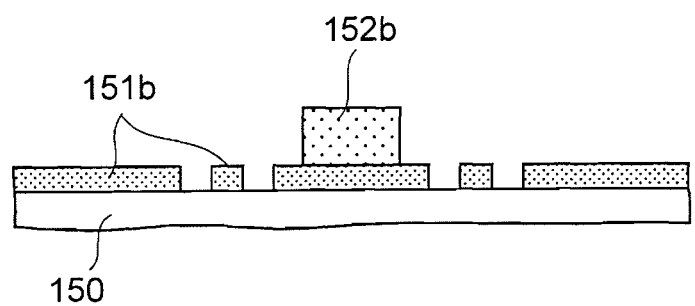

The exposed portion 151a with the development is removed to form a lower resist pattern 151b as illustrated in FIG. 16E. For the development, since a developing solution which selectively removes only exposed portion 151a is used, the upper resist pattern 152b is not removed by the development.

Figure 16F:
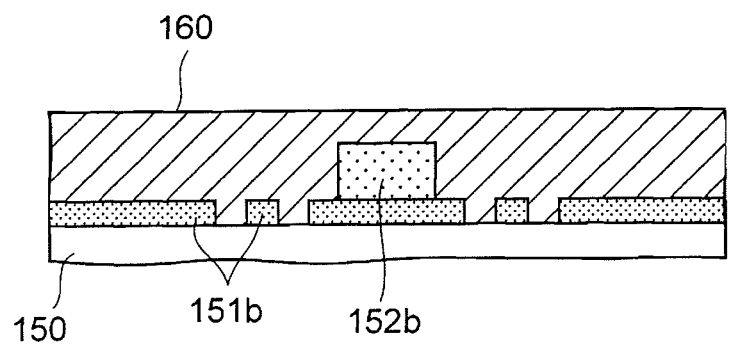

Subsequently, as illustrated in FIG. 16F, a metal layer is formed on each of the resist patterns 151b, 152b to form a master mold 160 formed of the metal layer. The metal layer is, for example, a nickel layer formed by electrolysis plating.

Figure 16G:
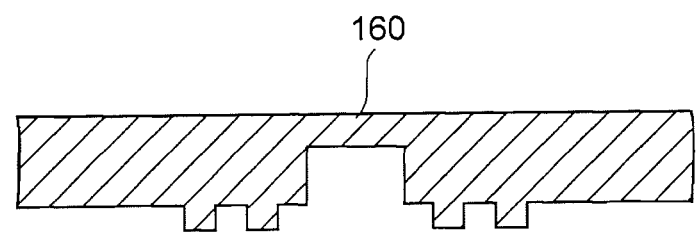

After that, each of the resist patterns 151b, 152b is removed by ashing, followed by releasing a master mold 160 from the silicon substrate 150 as illustrated in FIG. 16G.

Figure 16H:
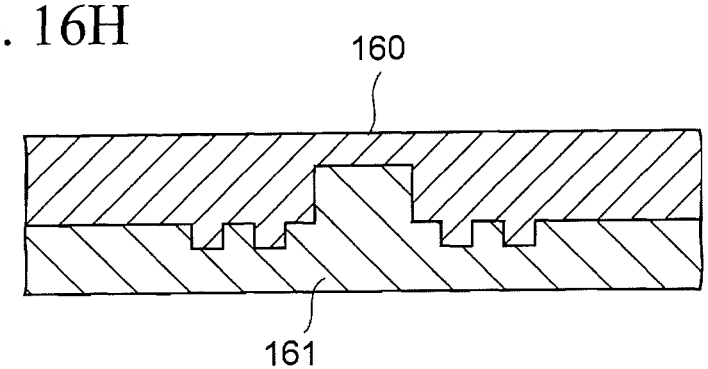

Next, as illustrated in FIG. 16H, the master mold 160 is molded with a resin to obtain a liner mold 161 made of the resin. Instead of molding with a resin, the master mold 160 is molded by nickel electroforming to fabricate the liner mold 161.

Figure 16I:
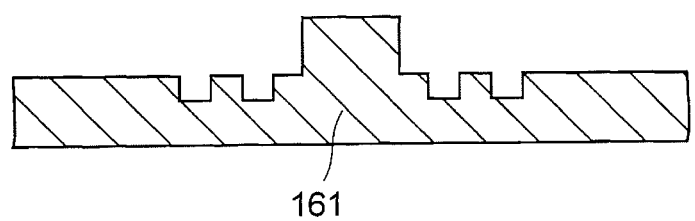

Subsequently, as illustrated in FIG. 16I, the liner mold 161 is removed from the master mold 160.

Thus, the liner mold 161 for fabricating conductor plate 14 (see FIG. 1A) is completed.

In order to fabricate the conductor plate 14, electroless copper plating and electrolytic copper plating are applied to the surface of the liner mold 161 in this order, then the relevant plating films are removed from the liner mold 161 so that the conductor plate 14 made of copper can be fabricated.

Fabricating the liner mold 161 as in the present example enables the conductor plates 14 having the same quality to be mass-produced at a low cost from the liner mold 161.

(11) Eleventh Embodiment

In the present embodiment, a method of manufacturing the conductor plate 100 effective for prevention of copper diffusion is described.

FIGS. 17A to 17E are cross-sectional views of the conductor plate in the course of manufacturing thereof according to the present example.

Figure 17A:
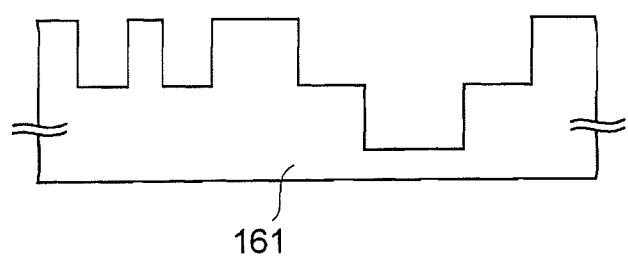
FIGS. 17A to 17E are cross-sectional views of a conductor plate in the course of manufacturing thereof according to an eleventh embodiment.

First, as illustrated in FIG. 17A, the liner mold 161 fabricated according to the third example of the tenth embodiment is prepared. Instead of the liner mold 161, the second liner mold 80 fabricated in the first example of the tenth embodiment, or the liner mold 86 fabricated in the second example of the tenth embodiment may be prepared.

Figure 17B:
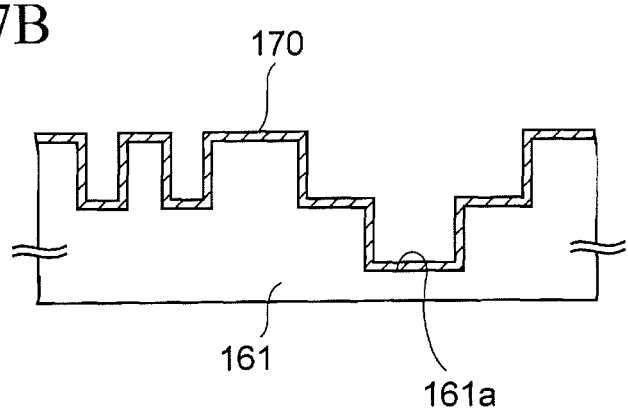

Next, as illustrated in FIG. 17B, the sputtering method is performed to form a titanium nitride film having a thickness of the order of 100 nm as a copper diffusion preventing film 170 on a mold face 161a of the liner mold 161.

The copper diffusion preventing film 170 is not limited to a titanium nitride film. As the copper diffusion preventing film 170, any one of a silicon nitride film, a titanium film, a tantalum film and a nitride tantalum film can be formed.

Also, in order to make the later-formed conductor plate 100 easily separate from the liner mold 161, an organic-based release agent layer having a thickness of several to 10 nm may be formed on the mold face 161a of the liner mold 161 before the formation of the copper diffusion preventing film 170.

Figure 17C:
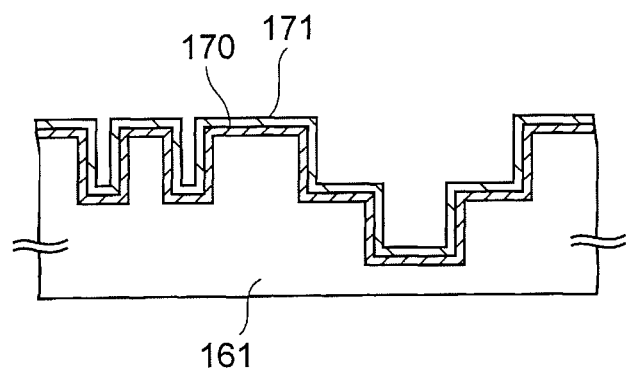

Then as illustrated in FIG. 17C, the sputtering method is carried out to form a titanium film having a thickness of the order of 100 nm, and a copper film having a thickness of the order of 500 nm as a seed layer 171 in this order on the copper diffusion preventing film 170.

Figure 17D:
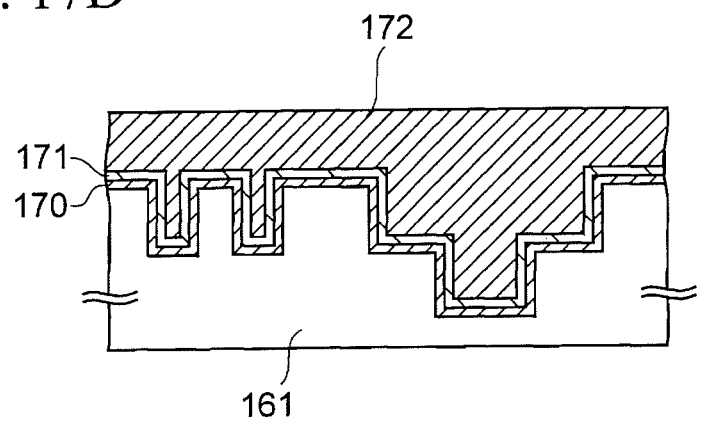

Subsequently, as illustrated in FIG. 17D, power is supplied from the seed layer 171 to form a copper plating layer 172 on the seed layer 171. Although the thickness of the copper plating layer 172 is not limited, the copper plating layer 172 is formed with a thickness of the order of 10 μm from the upper surface of the liner mold 161 in the present embodiment.

Figure 17E:
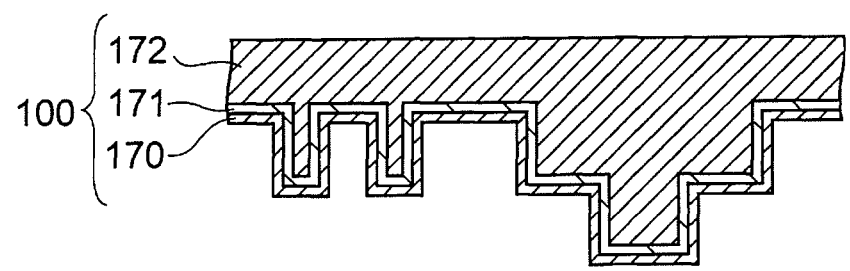

Subsequently, the copper plating layer 172 is released from the liner mold 161. Thereby the conductor plate 100 including the copper plating layer 172, the seed layer 171, and the copper diffusion preventing film 170 can be obtained as illustrated in FIG. 17E.

Although the copper diffusion preventing film 170 is formed on the mold face 161a of the liner mold 161 as illustrated in FIG. 17B in the above case, the method of forming the copper diffusion preventing film 170 is not limited to this method. For example, the conductor plate 100 may be formed in a state where the copper diffusion preventing film 170 is not formed yet, then the completion of the conductor plate 100 may be followed by performing the sputtering method to form the copper diffusion preventing film 170 on the surface of the conductor plate 100.

Figure 18:
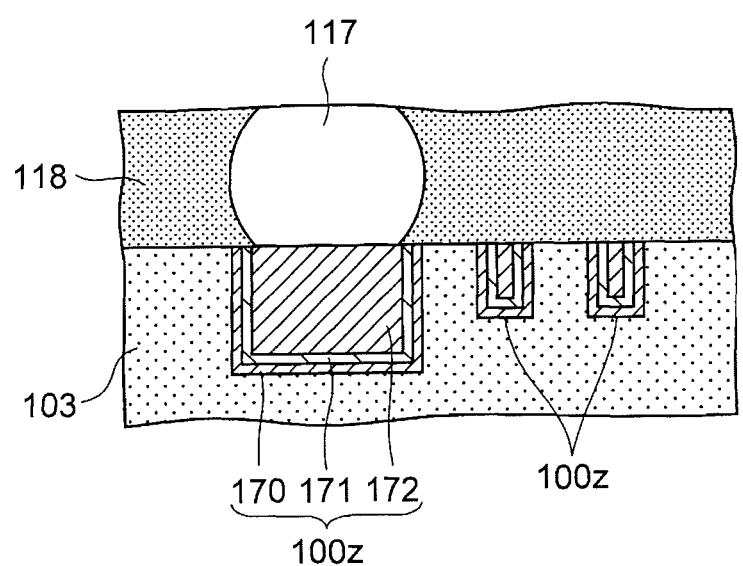
FIG. 18 is an enlarged cross-sectional view of an electronic device fabricated using the conductor plate according to the eleventh embodiment.

FIG. 18 is an enlarged cross-sectional view of the electronic component fabricated according to FIGS. 10A to 10F of the ninth embodiment while utilizing the conductor plate 100 formed of the copper diffusion preventing film 170 according to the present embodiment.

As illustrated in FIG. 18, since the copper diffusion preventing film 170 is formed in the conductor plate 100 as described above, the copper diffusion preventing film 170 is formed also in the conductor pattern 100z. The copper of the conductor pattern 100z is thus prevented from being diffused in the resin layer 103, and accordingly, the adjacent conductor patterns 100z can be effectively insulated by the resin layer 103.

All examples and conditional language recited herein are intended for pedagogical purposes to aid the reader in understanding the invention and the concepts contributed by the inventor to furthering the art, and are to be construed as being without limitation to such specifically recited examples and conditions, nor does the organization of such examples in the specification relate to a showing of the superiority and inferiority of the invention. Although the embodiments of the present inventions have been described in detail, it should be understood that the various changes, substitutions, and alterations could be made hereto without departing from the spirit and scope of the invention.

What is claimed is:

1. A method of manufacturing an electronic component comprising:

forming a resin layer over an underlying layer;

pressing a conductor plate having a pattern formed on one major surface thereof against the resin layer, and embedding the pattern in the resin layer; and performing polishing, Chemical Mechanical Polishing, or cutting by the use of a diamond bit on another major surface of the conductor plate until the resin layer appears, and leaving the pattern which is pressed against the resin layer and embedded in the resin layer as a conductor pattern, wherein, in the leaving the conductor pattern in the resin laxer a first portion and a second portion are formed in the conductor pattern, the second portion being thicker than the first portion, and the method further comprises bonding a protrusion electrode which includes a low melting point metal to the second portion of the conductor pattern after the conductor pattern is left in the resin layer.

2. The method of manufacturing an electronic component according to claim 1, further comprising:

forming a coating film of resin to cover the resin layer and the conductor pattern;

pressing the protrusion electrode into the coating film to make a protrusion electrode into contact with the conductor pattern; and heating and melting the protrusion electrode to bond the protrusion electrode and the conductor pattern.

3. The method of manufacturing an electronic component according to claim 2, wherein a coating film made of thermosetting resin is formed as the coating film, and in the heating the protrusion electrode, the coating film is heated and cured.

4. The method of manufacturing an electronic component according to claim 1, wherein the pattern of the conductor plate includes a copper film, and a copper diffusion preventing film is formed on the copper film.

5. The method of manufacturing an electronic component according to claim 1, wherein the pattern which is pressed against the resin layer and embedded in the resin layer includes a protrusion made into contact with the underlying layer.

6. The method of manufacturing an electronic component according to claim 5, wherein the protrusion includes a tip whose shape is deformed when the tip is made into contact with the underlying layer.

7. The method of manufacturing an electronic component according to claim 5, wherein a circuit board or a semiconductor device is used as the underlying layer, any one of the circuit board and the semiconductor including an electrode pad formed on a surface thereof; and in the step of embedding the pattern in the resin layer, the protrusion is made into contact with the electrode pad.

8. The method of manufacturing an electronic component according to claim 7, further comprising:

fixing a low melting point metal to a tip of the protrusion; and heating and melting the low melting point metal in a state where the pattern is embedded in the resin layer, and bonding the protrusion and the electrode pad via the low melting point metal.

9. The method of manufacturing an electronic component according to claim 1, wherein the pattern which is pressed against the resin layer and embedded in the resin layer includes a protrusion having a sharpened cone-like tip.

* * * * *